US008288241B2

(12) United States Patent
Hirota et al.

(10) Patent No.: US 8,288,241 B2
(45) Date of Patent: Oct. 16, 2012

(54) SEMICONDUCTOR DEVICE, METHOD OF MANUFACTURING THE SAME AND ADSORPTION SITE BLOCKING ATOMIC LAYER DEPOSITION METHOD

(75) Inventors: Toshiyuki Hirota, Chuo-ku (JP); Takakazu Kiyomura, Chuo-ku (JP); Yuichiro Morozumi, Nirasaki (JP); Shingo Hishiya, Nirasaki (JP)

(73) Assignees: Elpida Memory, Inc., Tokyo (JP); Tokyo Electron Limited (JP)

( * ) Notice: Subject to any disclaimer, the term of this patent is extended or adjusted under 35 U.S.C. 154(b) by 0 days.

(21) Appl. No.: 13/245,515

(22) Filed: Sep. 26, 2011

(65) Prior Publication Data
US 2012/0077322 A1 Mar. 29, 2012

(30) Foreign Application Priority Data
Sep. 27, 2010 (JP) ................................. 2010-215361

(51) Int. Cl.
*H01L 21/02* (2006.01)
(52) U.S. Cl. ................ 438/387; 438/763; 257/E21.011
(58) Field of Classification Search .................. 438/388, 438/768; 257/E21.017, E21.02, E21.35, 257/E21.351
See application file for complete search history.

(56) References Cited

U.S. PATENT DOCUMENTS
6,943,073 B2 * 9/2005 Marsh et al. .................. 438/210

FOREIGN PATENT DOCUMENTS
| JP | 2006-135339 A | 5/2006 |
| JP | 2007-073926 A | 3/2007 |
| JP | 2007-150242 A | 6/2007 |
| JP | 2007-281407 A | 10/2007 |

* cited by examiner

*Primary Examiner* — Cheung Lee
(74) *Attorney, Agent, or Firm* — Sughrue Mion, PLLC

(57) ABSTRACT

To provide a dielectric film having good crystallinity while suppressing an influence of the size effects and preventing the dielectric film from being divided by an Al-doped layer although there is provided the Al-doped layer for improving the leakage characteristics in the dielectric film of a capacitor, the dielectric film has at least one Al-doped layer, and an area density of Al atoms in one layer of the Al-doped layer is smaller than $1.4E+14$ atoms/cm$^2$. Further, to achieve the area density, there is employed a combination of formation of a dielectric film using a general ALD method and Al doping using an adsorption site blocking ALD method including adsorbing a blocker molecule restricting an adsorption site of an Al source, adsorbing the Al source, and introducing a reaction gas for reaction.

20 Claims, 19 Drawing Sheets

SEMICONDUCTOR DEVICE, METHOD OF MANUFACTURING THE SAME AND ADSORPTION SITE BLOCKING ATOMIC LAYER DEPOSITION METHOD

BACKGROUND OF THE INVENTION

1. Field of Invention

The present invention relates to a semiconductor device and a method of manufacturing the same, and specifically, to a semiconductor device having a capacitor, particularly, a dielectric film used for the capacitor and a method of manufacturing the same. Further, the present invention relates to a novel atomic layer deposition (ALD) method appropriate for introducing impurities in low concentration.

2. Description of Related Arts

As one of dielectric materials of a capacitor for a dynamic random access memory (DRAM), there is zirconium oxide ($ZrO_2$).

The DRAM requires heat treatment at a temperature of about 450° C. to 500° C. as an inevitable process after formation of a capacitor. In this case, it is impossible to obtain sufficient thermal stability by using a monolithic dielectric film of a zirconium oxide film and there is a problem of increasing leakage current after heat treatment.

Accordingly, various attempts have been made to add thermal stability, and there are a ZAZ structure ($TiN/ZrO_2/Al_2O_3/ZrO_2/TiN$, Z and A of ZAZ represent a $ZrO_2$ layer and an $Al_2O_3$ layer, respectively), a structure in which $Al_2O_3$ and $ZrO_2$ films are stacked many times, and the like.

There structures intend to achieve the desired characteristics by combining zirconium oxide ($ZrO_2$) having high permittivity and aluminum oxide ($Al_2O_3$) having excellent thermal stability despite low permittivity.

For example, JP 2006-135339A discloses a method of forming an AZ structure, a ZA structure, a ZAZ structure or a multi-layered dielectric film in which a $ZrO_2$ thin film and an $Al_2O_3$ thin film are alternately stacked far DRAM wherein a feature size (F value: ½ of a minimum pattern pitch) is equal to or less than 70 nm.

In formation of the thin film, the ALD method is used, $ZrCl_4$, $Zr[N(CH_3)C_2H_5]_4$, $Zr(O\text{-}tBu)_4$, $Zr[N(CH_3)_2]_4$, $Zr[N(C_2H_5)(CH_3)]_4$, $Zr[N(C_2H_5)_2]_4$, $Zr(tmhd)_4$, $Zr(OiC_3H_7)_3$(tmtd) and $Zr(OtBu)_4$ are disclosed as a Zr source, and $Al(CH_3)_3$ and $Al(C_2H_5)_3$ are disclosed as an Al source.

In the ALD method for obtaining a $ZrO_2$ thin film, the steps of adsorbing a Zr source on a surface of a substrate, discharging a non-adsorbed portion of the Zr source from a reaction chamber by a purge gas such as $N_2$ and Ar, oxidizing the adsorbed Zr source by a reaction gas such as $O_3$, and purging an unreacted portion of the reaction gas by the same purge gas as above are repeated as many times as desired.

Similarly, for obtaining an $Al_2O_3$ thin film, the steps of adsorbing an Al source on a surface of a substrate, discharging a non-adsorbed portion of the Al source from a reaction chamber by a purge gas such as $N_2$ and Ar, oxidizing the adsorbed Al source by a reaction gas such as $O_3$, and purging an unreacted portion of the reaction gas by the same purge gas as above are repeated as many times as desired.

Further, JP 2007-73926A discloses "a dielectric film including a first dielectric film having a relative permittivity of at least 25, a second dielectric film formed on the first dielectric film using a material having a crystallization rate lower than that of the first dielectric film, and a third dielectric film formed on the second dielectric film using the same material as that of the first dielectric film." It discloses a structure in which amorphous $Al_2O_3$ is present between crystallized $ZrO_2$ films.

The formation of the $ZrO_2$ film or $Al_2O_3$ film employs the same ALD method as in JP 2006-135339A. $Zr(O\text{-}t\text{-}Bu)_4$, $Zr[N(CH_3)_2]_4$, $Zr[N(C_2H_5)(CH_3)]_4$, $Zr[N(C_2H_5)_2]_4$, $Zr(tmhd)_4$, $Zr(OiC_3H_7)_3$(tmhd), $Zr(OtBu)_4$ and $Zr(OtBu)(C_2H_5CH_3)_3$ are disclosed as a Zr source, and trimethylaluminum (TMA:$Al(CH_3)_3$), $Al(C_2H_5)$ is disclosed as an Al source.

Further, JP 2007-281407A discloses, in order to obtain a tetragonal $ZrO_2$ structure having high permittivity, adding an extra $O_3$ step to an ALD sequence, a setting a temperature of a substrate to be 250° C. to 350° C., controlling $O_3$ concentration of an oxidizing agent to be 150 g/m³ or more, or the like.

In this case, $Zr(O\text{-}tBu)_4$, $Zr[N(CH_3)_2]_4$, $Zr[N(C_2H_5)(CH_3)]_4$, $Zr[N(C_2H_5)_2]_4$, $Zr(tmhd)_4$, $Zr(OiC_3H_7)_3$(tmhd), and $Zr(OtBu)_4$ are disclosed as a Zr source.

In addition, JP 2007-150242A discloses a method of manufacturing a capacitor having a $Zr_xAl_yO_z$ film in which zirconium, aluminum and oxygen are mixed at specific molar fractions of x, y and z by using an ALD method. In the $Zr_xAl_yO_z$ dielectric film, a sum of the molar fractions of x, y and z is 1 and the value dividing the molar fraction x by the molar fraction y ranges from 1 to 10 ($0.091 \leq y/(x+y) \leq 0.50$, i.e., a ratio of the number of atoms represented by $Al/(Al+Zr)$ may range from about 9 to 50 atom %).

Further, the step of forming the $Zr_xAl_yO_z$ dielectric film includes the steps of:
introducing a Zr source and adsorbing the Zr source on the lower electrode,
removing a non-adsorbed portion of the Zr source by supplying a first purge gas,
introducing an Al source and adsorbing the Al source on the Zr source adsorbed on the lower electrode,
removing a non-adsorbed portion of the Al source by supplying a second purge gas,
forming the $Zr_xAl_yO_z$ dielectric film by reaction of the Zr source and the Al source adsorbed on the lower electrode by supplying a reaction gas, and
removing an unreacted portion of the reaction gas by supplying a third purge gas.

As the Zr source, it discloses $ZrCl_4$, $Zr[N(CH_3)C_2H_5]_4$, $Zr(O\text{-}tBu)_4$, $Zr[N(CH_3)_2]_4$, $Zr[N(C_2H_5)(CH_3)]_4$, $Zr[N(C_2H_5)_2]_4$, $Zr(tmhd)_4$, $Zr(OiC_3H_7)_3$(tmtd), and $Zr(OtBu)_4$.

Incidentally, JP 2007-150242A does not mention whether the obtained dielectric film is crystalline or amorphous. Further, it does not disclose how to control molar fractions within the specific range.

The DRAM stores 1 bit in a unit cell configured as one transistor and one capacitor. As the number of bits increases, an occupation area per unit cell tends to be reduced. Currently, the generation of DRAM is shifted to F value of 40 nm or less, the occupation area per unit cell becomes more and more small.

Since the storage capacitance of a capacitor requires a predetermined amount (20 fF to 25 fF), although the occupation area per unit cell becomes smaller, it is required to ensure a predetermined amount of the storage capacitance. Accordingly, a steric structure of a capacitor has been developed in order to expand an electrode area, and an aspect ratio of the structure has been increased to exceed 30 in order to raise an electrode in a vertical direction of the substrate.

However, in a capacitor for DRAM since F value of 40 nm, it is considered that an aspect ratio of 35 is a limitation achievable by one dry etching in the current processing technology.

Therefore, in order to obtain a necessary storage capacitance of the capacitor, it is required to maintain leakage current of the capacitor to be equal to that of a conventional case (1E-7 A/cm$^2$ or less) and to make an equivalent oxide thickness (EOT) (value calculated by converting capacitance of the capacitor per unit area into an equivalent silicon oxide film thickness) smaller than a conventional case, i.e., to be equal to or less than 0.9 nm.

As described above, in order to realize a small EOT and small leakage current in a dielectric film formed for an electrode having a steric structure, it requires a capacitance film (dielectric film) having high permittivity, good coverage and sufficient thermal stability. Actually, these have a trade-off relationship.

1) Trade-Off Between Permittivity and Coverage

For example, since the permittivity of the amorphous $ZrO_2$ film is low, it is necessary to obtain the crystallized $ZrO_2$ film in order to obtain the capacitance film having high permittivity. Particularly, in order to obtain the $ZrO_2$ film having high permittivity and a tetragonal structure, as disclosed in JP 2007-281407A, it is necessary to form a film at a relatively high temperature.

However, the Zr source disclosed in the above-mentioned prior art documents is self-decomposed by heat in the film formation at a high temperature at which a tetragonal structure is obtained, and coverage is deteriorated. As a result, it has been found by the present inventors that it cannot be applied to the steric structure having an aspect ratio of 20 or more.

If the other conditions are the same, since the leakage current depends on the thickness at the thinnest portion of the dielectric film, the deterioration of the coverage causes non-uniformity of film thickness, and the film thickness of the dielectric film should be raised by a corresponding amount. Consequently, since it is impossible to reduce the EOT, the permittivity is hardly to be compatible with the coverage.

2) Trade-Off Between Thermal Stability and Permittivity

Further, in order to realize necessary thermal stability, it is required to set an Al amount introduced as an impurity and control its amount. This is because if the amount of Al is excessively large, it is hardly to obtain a film having high permittivity, and if the amount of Al is excessively small, it is hardly to obtain sufficient thermal stability.

The present inventors have conducted the same experiment again, and it could be found that sufficient thermal stability can be obtained, but crystallization of the $ZrO_2$ film is difficult in a range of Al concentration disclosed in JP 2007-150242A, and, thus, it is hardly to obtain a small EOT that may correspond to a device since F value of 40 nm.

Further, with regard to the amount of Al, not only an average concentration in the entire dielectric film, but also a local density is important. Unlike a PVD method or CVD method in which impurities can be relatively uniformly dispersed to a base material, it is general in addition of impurities by an ALD method that the concentration of impurities is formed in a film thickness direction by a film formation method unless the impurities are dispersed to the base marital due to a high temperature. However, in the film formation at a high temperature, the coverage is deteriorated as described in 1) above.

Meanwhile, there is a phenomenon generally called "size effects" in the crystallized dielectric film. As the film thickness decreases, the permittivity tends to decrease. In case of zirconium oxide, this phenomenon becomes severe in a physical film thickness smaller than about 6 nm.

For example, in a case where the $ZrO_2$ film is formed by the ALD method, and the $Al_2O_3$ film is formed by the ALD method in the same way during the film formation, if the area density of $Al_2O_3$ is higher than a certain value, $ZrO_2$ cannot be crystallized over the $Al_2O_3$ layer. Accordingly, the $ZrO_2$ crystal grains are separated vertically by the $Al_2O_3$ layer, and the $ZrO_2$ film is divided into vertically separate layers by the $Al_2O_3$ layer. As a result, even though a total film thickness is 6 nm or more, the permittivity of each of the $ZrO_2$ films divided by the $Al_2O_3$ layer is reduced by the size effects, and it is difficult to make the EOT of the total dielectric film small.

The present inventors have verified that in a combination of TMA serving as an Al source and a Zr source disclosed in the conventional technology, it is impossible to prevent division of the $ZrO_2$ film even by Al doping in which the $Al_2O_3$ layer is formed by one ALD cycle as disclosed in JP 2007-73926A.

Further, although Al doping was performed by selecting one ALD cycle of a $Zr_xAl_yO_z$ film disclosed in JP 2007-150242A and using the Zr source disclosed in the conventional technology, it was impossible to suppress the division of the $ZrO_2$ film.

As described above, it is difficult to avoid the division of the $ZrO_2$ film in the ZAZ structure by a conventional combination of the Zr source and the Al source and a conventional sequence.

Therefore, in order to obtain a small EOT, it is necessary to clarify a value of "area density of Al per one ALD cycle" to prevent the $ZrO_2$ film from being divided by an Al-doped layer, and find a means to realize the value.

SUMMARY

An important technical object is to provide a semiconductor device and a method of manufacturing the same capable of forming a film on a lower electrode of a capacitor having a steric structure and an aspect ratio of 20 or more with good coverage under process conditions of a high temperature (240° C. to 300° C.) to increase a permittivity, and preventing $ZrO_2$ crystals from being separated by an Al-doped layer by precisely adding an appropriate amount of Al.

To achieve the above object, the present invention includes the following configurations:

(1) An Al-doped dielectric film (including metal atoms M except for Al) is formed by an ALD method at a relatively high temperature (240° C. to 300° C.), and a concentration of Al added to improve thermal stability (Al/(Al+M)) is set to be 0.2 to 2 atom %.

(2) An area density of Al atoms in one cycle of ALD for Al doping is controlled to be smaller than 1.4E+14 [atoms/cm$^2$], preferably, equal to or smaller than 1.0E+14 [atoms/cm$^2$].

(3) In order to achieve the area density of (2), a combination of formation of a dielectric film using a general ALD method and Al doping using an adsorption site blocking ALD method is employed.

(4) The adsorption site blocking ALD method controls to suppress an area density for one ALD cycle of a target material (e.g., Al as an impurity in the dielectric film according to the present invention) by blocking an adsorption site of a source (precursor) of the target material using other molecules (blocker) in advance.

That is, according to an embodiment of the present invention, there is provided a semiconductor device including a capacitor having a dielectric film between a lower electrode and an upper electrode, wherein the dielectric film includes at least one Al-doped layer, and an area density of Al atoms in one layer of the Al-doped layer is smaller than 1.4E+14 [atoms/cm$^2$].

Further, according to another embodiment of the present invention, there is provided a method of manufacturing a semiconductor device including a capacitor having a dielectric film between a lower electrode and an upper electrode, the method comprising forming the dielectric film on the lower electrode by an atomic layer deposition method; and forming the upper electrode on the dielectric film, wherein the dielectric film includes first and second dielectric films formed of the same material, and an Al-doped layer inserted between the first and second dielectric films, and forming the Al-doped layer comprises sequentially:

(1) introducing a second source gas including a blocker molecule having a group with a low affinity to an Al precursor, and adsorbing the blocker molecule on the first dielectric film, (2) purging the second source gas, (3) adsorbing a first source gas including the Al precursor on an adsorption site of the first dielectric film on which the blocker molecule is not adsorbed, (4) purging the first source gas, (5) introducing a reaction gas to react with the blocker molecule adsorbed on the first dielectric film and the Al precursor for oxidizing at least Al atom in the Al precursor, and (6) purging an unreacted portion of the reaction gas and a by-product.

According to the present invention, it is possible to a dielectric film having good crystallinity, suppress an influence of the size effects, and have an area density at an Al-doped layer at which the dielectric film is not divided.

Further, according to a manufacturing method of the present invention, it is possible to achieve the area density.

BRIEF DESCRIPTION OF DRAWINGS

The above features and advantages of the present invention will be more apparent from the following description of certain preferred embodiments taken in conjunction with the accompanying drawings, in which:

FIGS. 5-1 and 5-2 show a flowchart of a process of manufacturing an Al-doped layer in accordance with the embodiment of the present invention, and schematically show a change in the surface state in this case;

DETAILED DESCRIPTION OF REFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purpose.

Hereinafter, embodiments of the present invention will be described in comparison with conventional techniques.

First, two conventional techniques of "Al doping method B" and "Al doping method C" will be described for comparison.

<Al Doping Method B (Conventional Technique)>

First, one of conventional techniques based on a method disclosed in JP 2006-135339A or JP 2007-73926A will be described. Hereinafter, this is referred to as "Al doping method B" for convenience.

The Al doping method B is close to a stacking structure of a $ZrO_2$ film and $Al_2O_3$ film rather than doping. That is, the $ZrO_2$ film is obtained by repeating, as many times as desired, the steps of (1) introducing a Zr source and adsorbing the Zr source on the surface of a base, (2) discharging a non-adsorbed portion of the Zr source from a reaction chamber by using a purge gas such as $N_2$ and Ar, (3) oxidizing the Zr source by using a reaction gas such as $O_3$, and (4) purging an unreacted portion of the reaction gas.

Further, the $Al_2O_3$ film is obtained in the same way by repeating, as many times as desired, the steps of (1) introducing an Al source and adsorbing the Al source on the surface of a base, (2) discharging a non-adsorbed portion of the Al source from a reaction chamber by using a purge gas such as $N_2$ and Ar, (3) oxidizing the Al source by using a reaction gas such as $O_3$, and (4) purging an unreacted portion of the reaction gas.

JP 2006-135339A and JP 2007-73926A disclose a ZAZ structure in which an $Al_2O_3$ film is inserted between $ZrO_2$ films. In the ZAZ structure of JP 2006-135339A, one of the $ZrO_2$ films has a thickness of 0.5 nm to 5.0 nm, and the $Al_2O_3$ film has a thickness of 0.5 nm to 1.5 nm. In the ZAZ structure of JP 2007-73926A, the crystallized $ZrO_2$ film has a thickness of 3.5 nm to 4.5 nm, the $Al_2O_3$ film (amorphous film) has a thickness of 0.1 nm to 1 nm, and a total dielectric film has a thickness of 7 to 10 nm.

Figure 3:
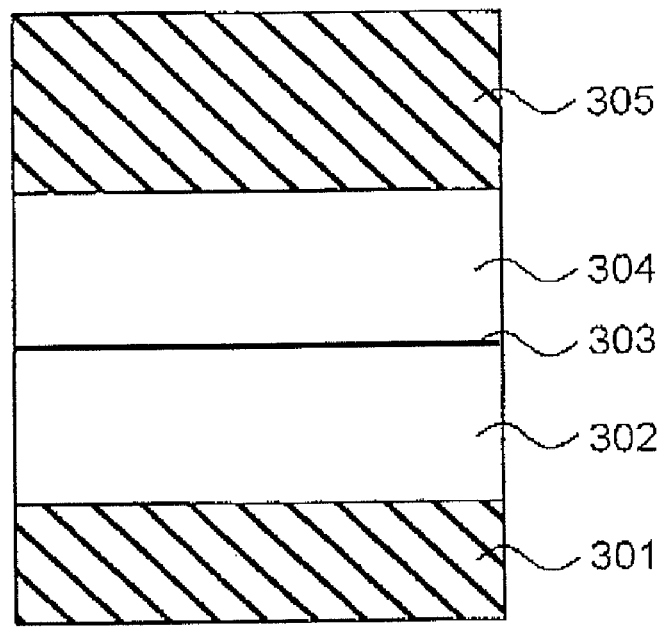
FIG. 3 schematically shows a cross-sectional view of a structure of a capacitor of a conventional example (Al doping method B)

FIG. 3 schematically shows a cross-sectional view of a capacitor formed by the Al doping method B. In FIG. 3, reference numeral 301 denotes a lower electrode, reference numeral 302 denotes a first $ZrO_2$ layer, reference numeral 303 denotes an Al-doped layer ($Al_2O_3$ film), reference numeral 304 denotes a second $ZrO_2$ layer, and reference numeral 305 denotes an upper electrode.

Figure 6:
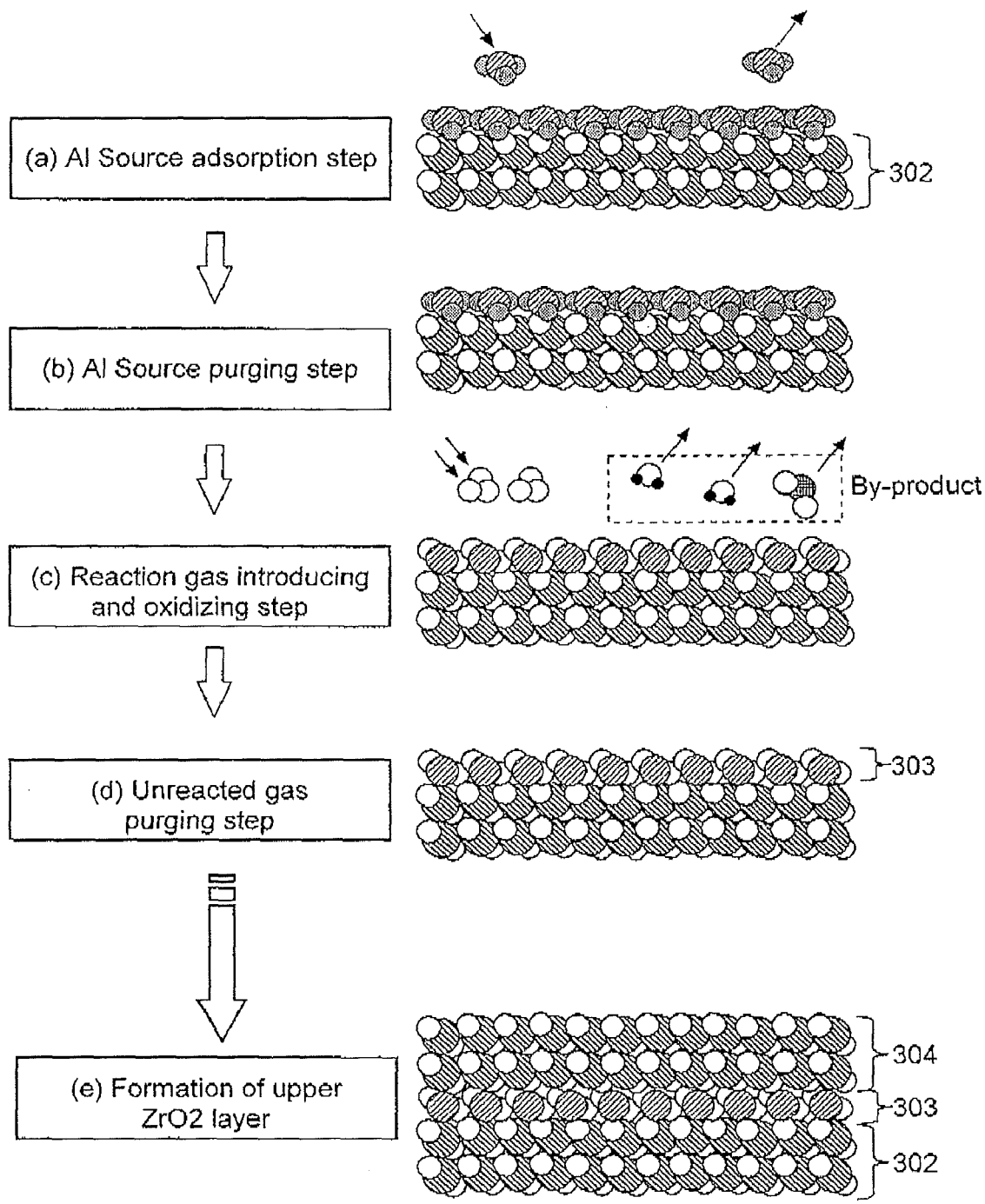
FIG. 6 shows a flowchart of a process of manufacturing an Al-doped layer in accordance with a conventional example (Al doping method B), and schematically show a change in the surface state in this case.

FIG. 6 shows a flowchart of the Al doping method B in which, e.g., an ALD cycle for doping Al in the $ZrO_2$ film (ALD cycle for forming the Al-doped layer 303) is performed once, and schematically shows a change in the surface state in this case. As shown in FIG. 6, the first $ZrO_2$ layer 302 and the second $ZrO_2$ layer 304 are separated from each other by the Al-doped layer 303.

<Al Doping Method C (Conventional Technique)>

Next, a sequence obtained by combining a method disclosed in JP 2006-135339A or JP 2007-73926A, part of a method disclosed in JP 2007-150242A and a conventional source will be described. Hereinafter, this is referred to as "Al doping method C" for convenience.

The Al doping method C is performed by using a combination of an ALD cycle for doping Al, part of an ALD sequence of a $Zr_xAl_yO_z$ film disclosed in JP 2007-150242A, and a conventional Zr source (Zr precursor) disclosed in the above-mentioned prior art document.

That is, the Al doping method C includes the steps of:

(1) introducing a Zr source (in this case, $Zr[N(CH_3)C_2H_5]_4$) and adsorbing the Zr source on a first $ZrO_2$ film that has been formed previously, (2) removing a non-adsorbed portion of the Zr source by supplying a first purge gas, (3) introducing an Al source and adsorbing the Al source on the Zr source adsorbed on the first $ZrO_2$ film, (4) removing a non-adsorbed portion of the Al source by supplying a second purge gas, (5) oxidizing the Zr source and the Al source by reaction of the Zr source and the Al source adsorbed on a lower electrode by supplying a reaction gas, and (6) removing an unreacted portion of the reaction gas by supplying a third purge gas.

A $Zr_xAl_yO_z$ film is formed on the $ZrO_2$ film by repeating the above-described steps as many times as desired, and a second $ZrO_2$ film is formed thereon by using the ALD cycle disclosed in JP 2006-135339A or JP 2007-73926A.

Figure 4:
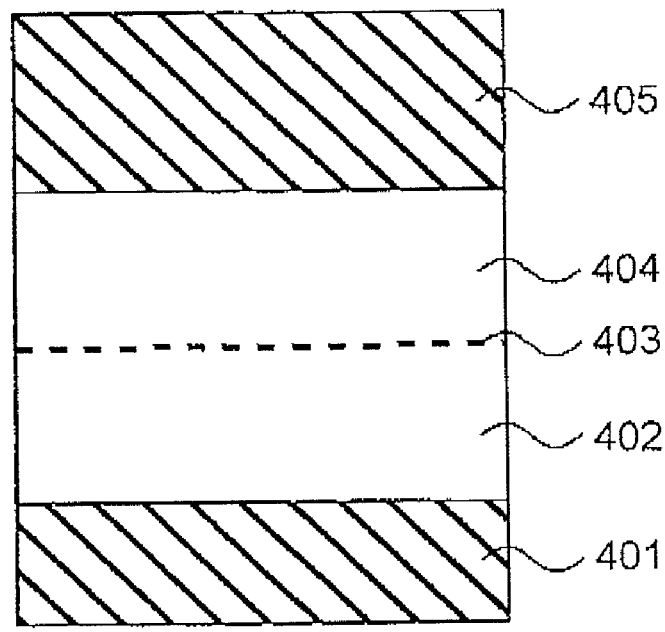
FIG. 4 schematically shows a cross-sectional view of a structure of a capacitor of another conventional example (Al doping method C)

FIG. 4 schematically shows a cross-sectional view of a capacitor formed by the Al doping method C. In FIG. 4, reference numeral 401 denotes a lower electrode, reference numeral 402 denotes a first $ZrO_2$ layer, reference numeral 403 denotes an Al-doped layer ($Zr_xAl_yO_z$ film), reference numeral 404 denotes a second $ZrO_2$ layer, and reference numeral 405 denotes an upper electrode.

Figure 7:
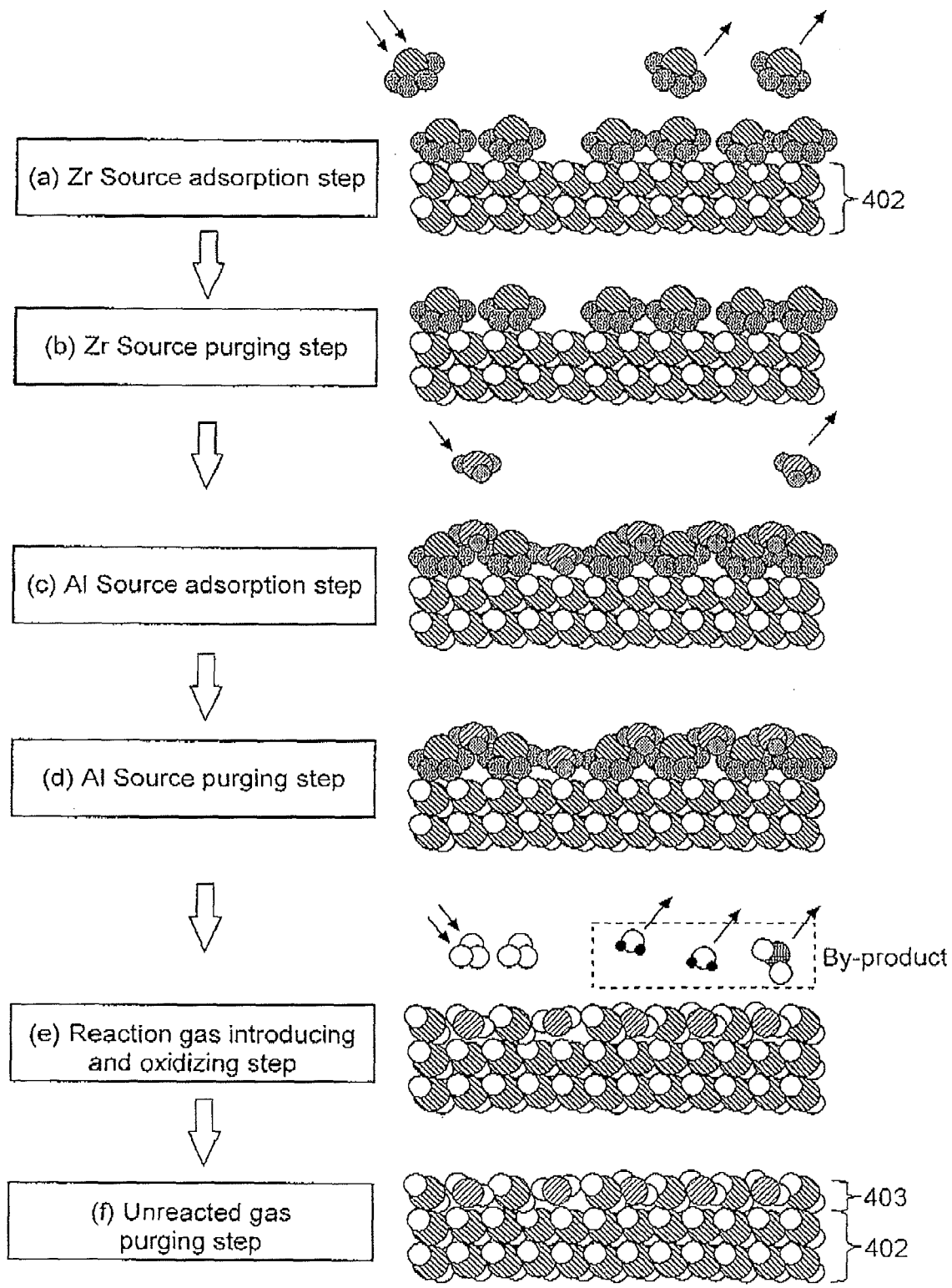
FIG. 7 shows a flowchart of a process of manufacturing an Al-doped layer in accordance with another conventional example (Al doping method C), and schematically show a change in the surface state in this case.

FIG. 7 shows a flowchart of the Al doping method C in which, e.g., an ALD cycle for forming the Al-doped layer 403 is performed once, and schematically shows a change in the surface state in this case.

A detailed embodiment of "Al doping method A" in accordance with the present invention will be described.

<Al Doping Method A (Present Invention)>

The present inventors have newly developed a method of doping low-concentration Al in a $ZrO_2$ dielectric film with good controllability and stability, called an adsorption site blocking ALD method (ASB-ALD method). Hereinafter, a method for doping Al in the $ZrO_2$ dielectric film using this method is referred to as "Al doping method A" for convenience.

The ASB-ALD method has a sequence of the ALD cycle similar to that of the Al doping method C. However, there is a difference in that the ALD cycle for impurity doping is controlled such that before adsorbing an impurity source (impurity precursor) on a base material, an adsorption site of the impurity source is blocked by other molecule (hereinafter, referred to as a "blocker") to suppress the adsorption amount of the impurity source.

The molecule for the blocker are required to have the following properties:

The blocker is adsorbed on an adsorption site of the impurity source (precursor) to be blocked.

The adsorption of the blocker is more stable than the impurity source (precursor) to be blocked.

The blocker does not react with a molecule to be blocked, or does not become a new adsorption site of the molecule to be blocked.

The blocker can be easily removed, or even if a portion of the blocker remains, a product thereof has the same material as the base material.

The blocker is hardly self-decomposed at a temperature of a film forming process (excellent thermal stability).

The blocker has an appropriate steric hindrance, and even after the adsorption site is blocked, a predetermined amount of the adsorption site of the base is stably left.

A vapor pressure is sufficient.

That is, the ASB-ALD method in accordance with the present invention is a method of depositing a first material different from the base material on the base material by the ALD method, which includes the steps of:

before introducing a first source gas including a first precursor as a source of the first material in a film forming space, introducing a second gas including a blocker molecule having a group with a low affinity to the first precursor in the film forming space, and restricting the adsorption site of the first precursor on the base material by adsorbing the blocker molecule on the base material, purging the second gas, introducing the first source gas in the film forming space, and adsorbing the first precursor on the adsorption site restricted on the base material, purging the first source gas, and introducing a reaction gas in the film forming space, and reacting the reaction gas with at least the first precursor to be converted into the first material.

The blocker molecule includes a group which is easy to be adsorbed on the base material, and a group which is relatively difficult to be adsorbed on the base material. The blocker molecule itself performs an oriented adsorption such that the group which is difficult to be adsorbed is self-organized toward the outside. Further, the group which is difficult to be adsorbed is a group having a low affinity for the first precursor to block adsorption of the first precursor to the blocker molecule.

Further, the following concepts are preferable:

the base material is metal oxide;

the blocker molecule is a metal complex which has a metal atom constituting the metal oxide of the base material and has a group which is easy to be adsorbed on the base material and a group which is relatively difficult to be adsorbed on the base material as a substituent or ligand; and the reaction gas is an oxidative gas to form a film in which the first material is doped in the metal oxide of the base material by reacting the reaction gas with the blocker molecule.

Further, preferably, the blocker molecule is a monocyclopentadienyl metal complex coordinating a cyclopentadiene ring, which may be substituted, and having a plurality of polar groups. The polar group is a group which is relatively easy to be adsorbed on the base material compared to the cyclopentadiene ring, and includes a hetero atom such as a nitrogen atom and an oxygen atom. For example, the polar group may be an alkylamino group, an alkoxy group, a carbonyl group or the like included in a conventional precursor. The cyclopentadiene ring is generally a group having a larger volume than the polar group, and provides an appropriate steric hindrance. Also, the cyclopentadiene ring is a group having a low affinity to the first precursor. As a substituent which the cyclopentadiene ring may have, a group which increases an affinity to the first precursor (e.g., a group including a hetero atom of the polar group or the like) is not preferable, and a hydrocarbon group, particularly, an alkyl group, and more particularly, a lower alkyl group is preferable. The cyclopentadiene ring which has such a substituent increases a steric hindrance and may further increase thermal stability according to the occasions. The substituent can be appropriately selected considering a combination with the first precursor introduced as an impurity, or ease of synthesis.

The first source gas, the second gas, and the reaction gas may include an inert gas such as Ar and $N_2$ as a carrier gas in addition to the first precursor, the blocker molecule and an object gas of the reaction (oxidizing gas such as $O_3$).

Further, The present inventors have found that when Al is doped as an impurity in a $ZrO_2$ film that is a dielectric film, in case of using the adsorption site blocking ALD method, a combination of TMA (Al source) and $ZrCp(NMe_2)_3$ (cyclopentadienyl tris(dimethylamino)zirconium, hereinafter referred to as "CTMAZ") or $Zr(MeCp)(NMe_2)_3$ (methylcyclopentadienyl tris(dimethylamino)zirconium, hereinafter referred to as "MCTMAZ") (Zr source and blocker of TMA) is appropriate. Particularly, the cyclopentadiene ring functions as a blocker and contributes to improvement of thermal stability of the Zr source.

The CTMAZ and MCTMAZ have the following structures:

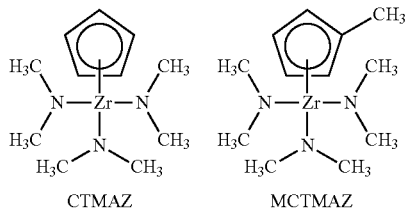

CTMAZ          MCTMAZ

These Zr sources have one cyclopentadiene ring and three alkyl amino groups. It is considered that they are adsorbed such that the alkyl amino groups are oriented toward a surface to be adsorbed. That is, the alkyl amino group is a group which is easy to be adsorbed on the base material, and the cyclopentadiene ring is a group which is relatively difficult to be adsorbed on the base material than the alkyl amino group, and has a low affinity to the Al source. An oriented adsorption is performed such that the cyclopentadiene ring is self-organized toward the outside.

The Al doping method A of the present invention employs these Zr sources and the ALD sequence as described below.

That is, the first $ZrO_2$ layer of a lower layer is formed, as disclosed in JP 2006-135339A or JP 2007-73926A, by repeating, as many times as desired, the steps of adsorbing the Zr source (Zr precursor) on the surface of a substrate, discharging a non-adsorbed portion of the Zr source from the reaction chamber by using a purge gas such as $N_2$ and Ar, oxidizing the Zr source by using a reaction gas such as $O_3$, and purging an unreacted portion of the $O_3$ gas. In this case, CTMAZ or MCTMAZ is used as the Zr source, but a conventional Zr source can be used. However, in case of using CTMAZ or MCTMAZ, a film forming temperature ranges from 240° C. to 300° C., and in case of using a conventional Zr source, a film forming temperature ranges from 210° C. to 280° C. In CTMAZ or MCTMAZ, film formation is possible at a higher temperature than the conventional Zr source. In the film formation at a higher temperature, the near-tetragonal $ZrO_2$ film can be formed and it is easy to obtain a film having high permittivity. Further, CTMAZ or MCTMAZ has excellent coverage in the high temperature film formation than the conventional Zr source.

The ALD sequence of Al doping sequentially includes:

(1) introducing a second source gas including a blocker (in this case, CTMAZ or MCTMAZ) and adsorbing the blocker on the first $ZrO_2$ layer as a base material, (2) purging the second source gas to remove a non-adsorbed portion of the blocker by supplying a purge gas (Ar, $N_2$), (3) introducing a first source gas including the Al source (in this case, TMA), and adsorbing the Al source on the adsorption site of the first $ZrO_2$ layer which is not completely blocked by the blocker, (4) purging the first source gas to remove a non-adsorbed portion of the Al source by supplying a purge gas, (5) forming an Al-doped layer by supplying a reaction gas ($O_3/O_2$) to react with the Zr source also serving as the blocker and the Al source adsorbed on the first $ZrO_2$ layer, and (6) removing (purging) an unreacted portion of the reaction gas and a by-product by supplying a purge gas.

By repeating the above steps as any times as desired, the Al-doped layer is formed on the first $ZrO_2$ layer, and the second $ZrO_2$ layer is formed thereon by using the ALD cycle as disclosed in JP 2006-135339A or JP 2007-73926A.

Figure 1:
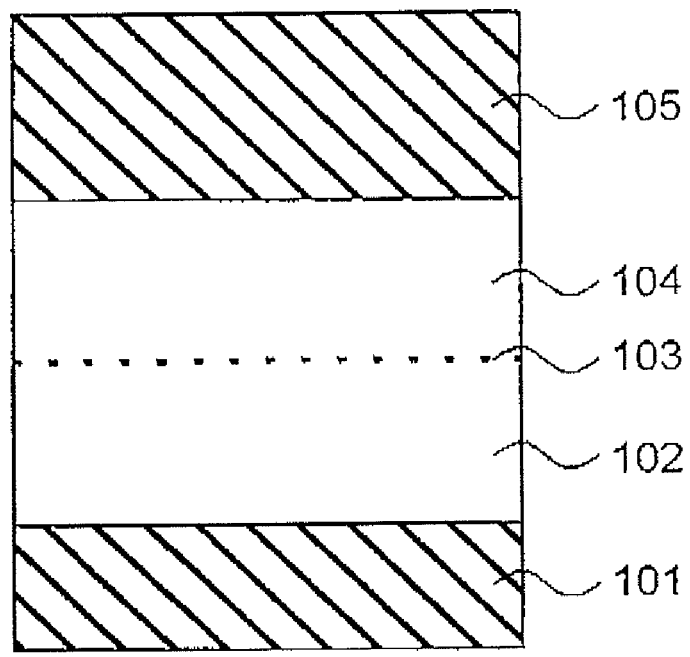
FIG. 1 schematically shows a cross-sectional view of a structure of a capacitor in accordance with an embodiment of the present invention.

FIG. 1 schematically shows a cross-sectional view of a capacitor formed by the Al doping method A. In FIG. 1, reference numeral 101 denotes a lower electrode, reference numeral 102 denotes a first $ZrO_2$ layer, reference numeral 103 denotes an Al-doped layer, reference numeral 104 denotes a second $ZrO_2$ layer, and reference numeral 105 denotes an upper electrode.

Figure 2:
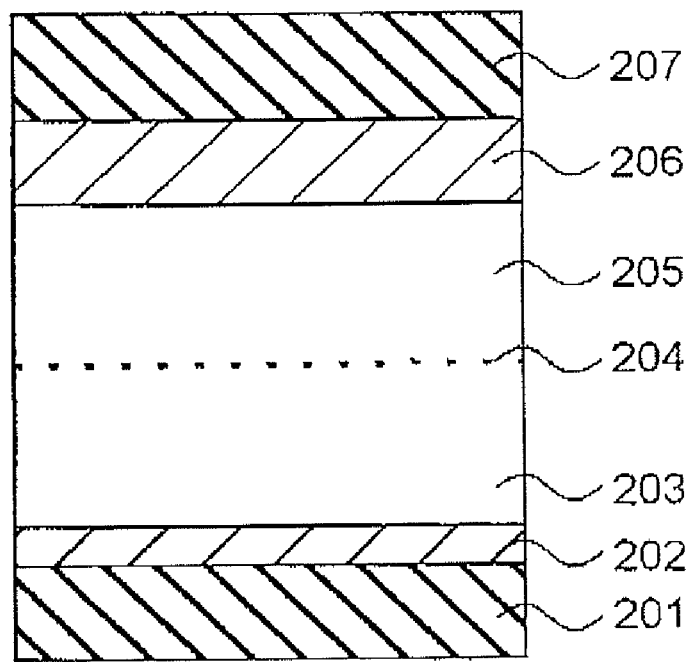
FIG. 2 schematically shows a cross-sectional view of a structure of a capacitor in accordance with another embodiment of the present invention.
Figures 1, 5:
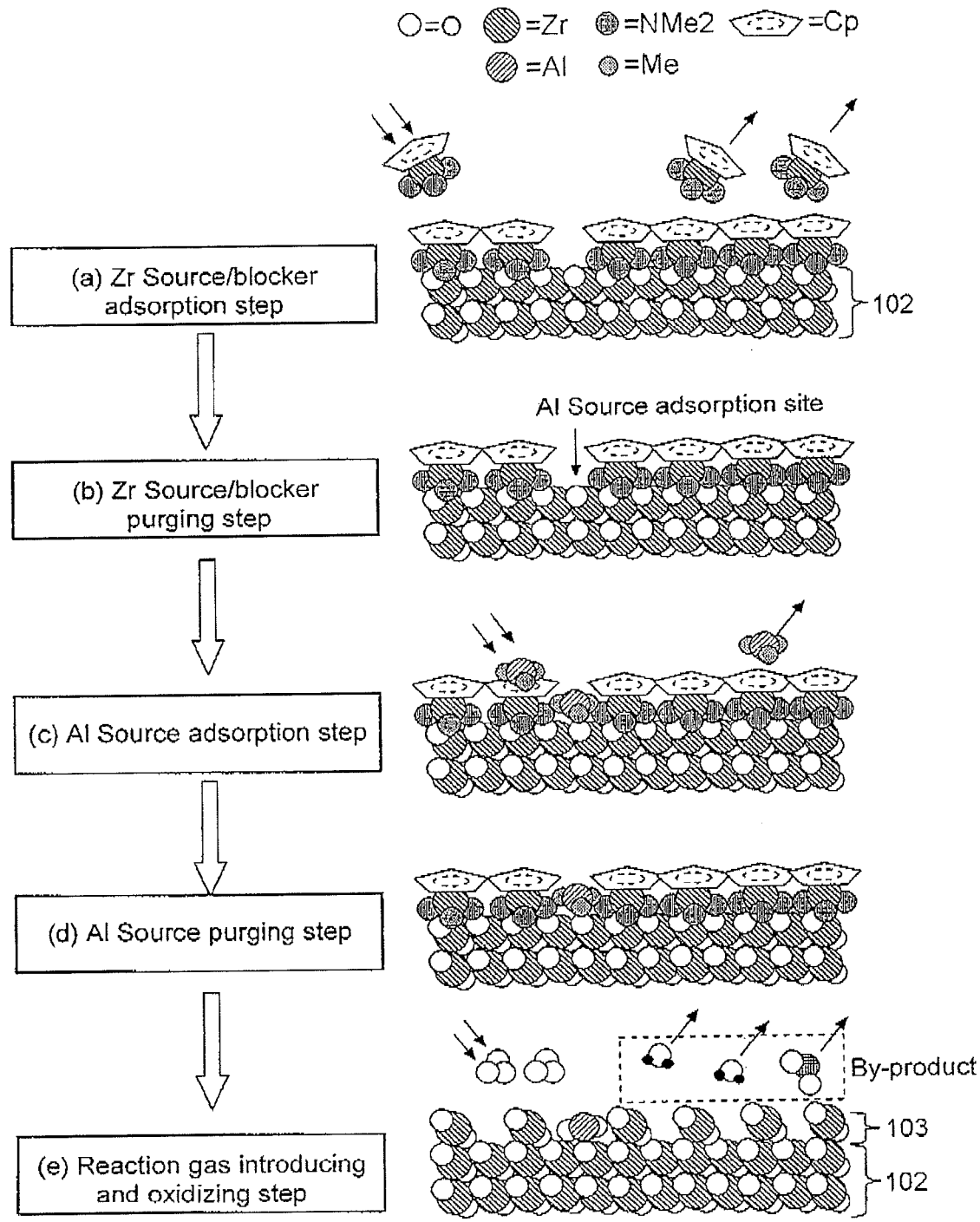
Figures 2, 5:
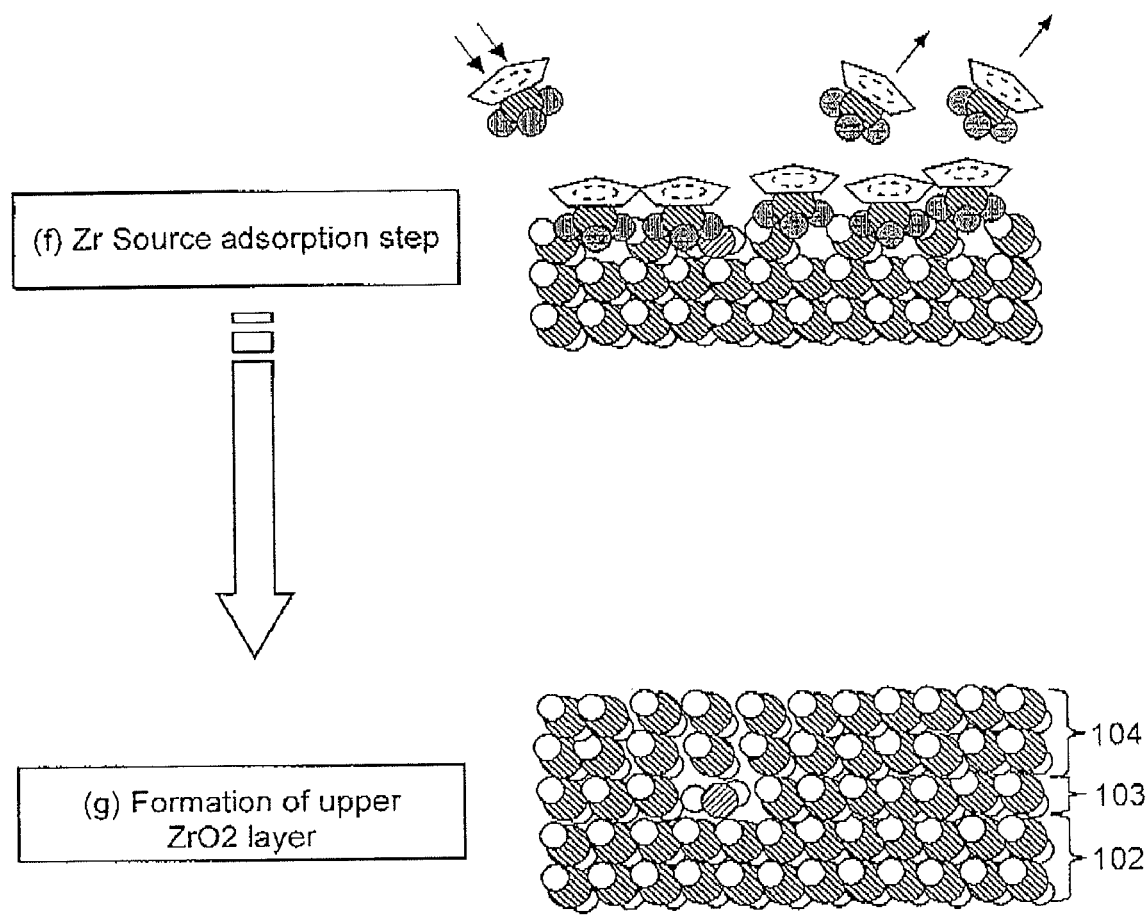

FIGS. 5-1 and 5-2 show a flowchart of the adsorption site blocking ALD method in which, e.g., an ALD cycle for doping Al in the $ZrO_2$ film is performed once, and schematically show a change in the surface state in this case.

First, as shown in (a) of FIG. 5-1, CTMAZ or MCTMAZ (in this case, CTMAZ) is supplied as a Zr source and blocker on the first $ZrO_2$ layer 102 and adsorbed on its surface. As a result, the alkyl amino groups are adsorbed on the surface of the first $ZrO_2$ layer 102 and the cyclopentadiene ring is oriented toward the outside (self-organized and oriented adsorption).

Meanwhile, since the CTMAZ and MCTMAZ have an appropriate steric hindrance due to the cyclopentadiene ring having a large volume, it never completely covers the surface of the first $ZrO_2$ layer 102 of the base.

Accordingly, a predetermined amount of "gap" is stably formed on the first $ZrO_2$ layer 102.

The "gap" remains even after a non-adsorbed portion of the Zr source (blocker) by purging as shown in (b) of FIG. 5-1 and becomes an Al source adsorption site.

Thereafter, as shown in (c) of FIG. 5-1, when TMA is supplied as the Al source, TMA molecules are adsorbed on the surface of the first $ZrO_2$ layer 102 as the Al source adsorption site exposed from the "gap" of the blocker.

The TMA molecules accommodated in the Zr source (blocker) stably remain although purged as shown in (d) of FIG. 5-1. Meanwhile, since the cyclopentadiene ring and TMA lack an affinity, TMA is hardly adsorbed on the cyclopentadiene ring.

In JP 2007-150242A, as shown in FIG. 7, a $Zr_xAl_yO_z$ film is formed by actively using the fact that TMA of the Al source is also adsorbed on the Zr source. On the other hand, the Zr source selected in the present invention can efficiently block the TMA using the cyclopentadiene ring and control an adsorption amount of TMA by self-organized and oriented adsorption. Further, since the CTMAZ and MCTMAZ have excellent thermal stability compared to the conventional Zr source, they are difficult to be thermally decomposed under film formation conditions of a high temperature (240° C. to 300° C.) at which a $ZrO_2$ film having high permittivity is obtained. Since they are difficult to be thermally decomposed, it is difficult that the cyclopentadiene ring is eliminated during the purge or supply of TMA and this place becomes the adsorption site of TMA.

Thereafter, as shown in (e) of FIG. 5-1, an oxidizing gas including $O_3$ is supplied as the reaction gas. Accordingly, the Zr source and the Al source are oxidized and decomposed to form an oxide, and then, a non-adsorbed portion of the reaction gas and a by-product are purged.

As a result, it is possible to form a surface on which $ZrO_2$ is mostly formed and aluminum oxide is studded.

Subsequently, in order to additionally form the second $ZrO_2$ layer 104, a Zr source adsorption step (f), a purging step (not shown), a reaction gas supplying and oxidizing step (not shown), and an unreacted gas purging step (not shown) are repeated as prescribed times, thereby obtaining a film in which a certain amount of Al is doped as an impurity between the $ZrO_2$ films (the first $ZrO_2$ film 102 and the second $ZrO_2$ film 104).

The present inventors formed a flat capacitor having the following structure using the Al doping method A, the Al doping method B, and the Al doping method C as described above, and investigated the characteristics thereof.

Further, an example of a structure wherein an Al-doped $ZrO_2$ dielectric film is inserted into $TiO_2$ will be described. This structure is not a conventional well-known structure and has been developed by some of the inventors on their own. Accordingly, a capacitor sample of each doping method that will be described is not a conventional technology.

The inventors have found that a very thin $TiO_2$ film combined with TiN serving as an electrode of a capacitor, particularly, a $TiO_2$ film in contact with an upper electrode, does not function as a dielectric film at a thickness of 1 nm or more, and functions as a part of the upper electrode. In the present invention, the formation of the $TiO_2$ film suppresses an interfacial reaction, increases adhesiveness and stabilizes capacitor characteristics, a structure in which the $TiO_2$ film is provided at an interface between the TiN electrode and the Al-doped $ZrO_2$ film is employed to perform evaluation and comparison of the respective doping methods. However, the $TiO_2$ film is not essential for the present invention.

{Formation of Capacitor Sample by Al Doping Method A}

FIG. 2 schematically shows a structure of a capacitor manufactured by the Al doping method A. A $TiO_2$ film 202 was formed on a TiN lower electrode 201 (having a TiN film thickness of 10 nm) by using the ALD method. $Ti(CpMe)(NMe_2)_3$ (methylcyclopentadienyl tris(dimethylamino)titanium, hereinafter referred to as "TiMCTA") was used as a Ti source.

A molecular structure of TiMCTA is illustrated below.

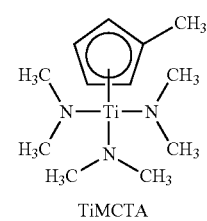

TiMCTA

Since TiMCTA also has a cyclopentadienyl ring in the same way as CTMAZ, it is a Ti source, with improved thermal stability. The supply and purge of the TiMCTA and the supply and purge of a reaction gas ($O_3$) were set as one cycle and five cycles were performed. Accordingly, the first $TiO_2$ film 202 having a thickness of about 0.5 nm was formed.

Then, in the same way, a first $ZrO_2$ layer 203 was formed to have a thickness of 3 nm by the ALD sequence using CTMAZ.

Then, an Al-doped layer 204 was formed by using the Al doping method A.

Each sample was prepared by sequentially setting the number of ALD cycles of the Al doping method A to be 0 (no Al doping) to 10.

Then, a second $ZrO_2$ layer 205 was further formed to have a thickness of 3 nm by performing the ALD sequence of the $ZrO_2$ film on the Al-doped layer 204 as prescribed times.

Further, a second $TiO_2$ film 206 was formed to have a thickness of 1 nm on the second $ZrO_2$ layer 205. The same method as the method for forming the first $TiO_2$ film 202 was used and only a film thickness was changed.

The film formation from the first $TiO_2$ film 202 at the lower side to the second $TiO_2$ film 206 at the upper side was performed in the same reaction chamber, and a film forming temperature was 250° C. Further, since all of the TMA, CTMAZ and TiMCTA have excellent thermal stability, film formation at a higher temperature is also possible.

Then, a TiN film was formed as an upper electrode 207 to have a thickness of 8 nm by using a previously known CVD method. Subsequently, a boron-doped silicon germanium film (B-SiGe film) was formed at a temperature of 450° C. to have a thickness of 150 nm by using a previously known LP-CVD method, and the upper electrode was patterned by previously known lithography and dry etching.

Then, a $H_2$ process was performed for two hours at a temperature of 450° C. by a heat load inevitable for a DRAM process.

{Formation of Capacitor Sample by al Doping Method B}

Next, a capacitor sample in which the first $ZrO_2$ layer 203 to the second $ZrO_2$ layer 205 of FIG. 2 are replaced with the first $ZrO_2$ layer 302 to the second $ZrO_2$ layer 304 of FIG. 3 was fabricated.

In the same way as above, the first TiO$_2$ film having a thickness of about 0.5 nm was formed on the TiN lower electrode (having a TiN film thickness of 10 nm) by using the ALD method.

Then, the first ZrO$_2$ layer 302 was formed to have a thickness of 3 nm by using the method of JP 2006-135339A or JP 2007-73926A as shown in FIG. 3. As the Zr source (Zr precursor), TEMAZ (Zr[N(CH$_3$)CH$_2$CH$_3$]$_4$) (tetrakis(ethylmethylamino)zirconium) that is a representative example of a conventional Zr source was used.

Then, the Al-doped layer 303 was formed by using the Al doping method B illustrated in FIG. 6. Each sample was fabricated by setting the number of ALD cycles for the Al-doped layer 303 to be 0 (no Al doping) to 10.

Then, a second ZrO$_2$ layer 304 having a thickness of 3 nm was further formed on the Al-doped layer 303 by performing the same method as the first ZrO$_2$ layer 302 as prescribed times. Further, a second TiO$_2$ film 206 having a thickness of 1 nm was formed on the second ZrO$_2$ layer 304 by using the same method as above.

The film formation from the first TiO$_2$ film to the second TiO$_2$ film was performed in the same reaction chamber, and a film forming temperature was 250° C.

Then, a TiN film was formed as an upper electrode to have a thickness of 8 nm by using a previously known CVD method. Subsequently, a boron-doped silicon germanium film (B-SiGe film) was formed at a temperature of 450° C. to have a thickness of 150 nm by using a previously known LP-CVD method, and the upper electrode was patterned by previously known lithography and dry etching. Then, a H$_2$ process was performed for two hours at a temperature of 450° C. by a heat load inevitable for a DRAM process.

{Formation of Capacitor Sample by al Doping Method C}

Next, a capacitor sample in which the first ZrO$_2$ layer 203 to the second ZrO$_2$ layer 205 of FIG. 2 are replaced with the first ZrO$_2$ layer 402 to the second ZrO$_2$ layer 404 of FIG. 4 was fabricated.

In the same way as above, the first TiO$_2$ film having a thickness of about 0.5 nm was formed on the TiN lower electrode (having a TiN film thickness of 10 nm) by using the ALD method.

Then, the first ZrO$_2$ layer 402 was formed to have a thickness of 3 nm by using the same method as the Al doping method B.

Then, the Al-doped layer 403 was formed by using the Al doping method C. As the Zr source, TEMAZ that is a representative example of a conventional Zr source was used. As the Al source, TMA was used.

Each sample was fabricated by setting the number of ALD cycles of the ALD sequence of the Al doping method C to be 0 (no Al doping) to 10.

Then, the second ZrO$_2$ layer 404 having a thickness of 3 nm was further formed on the Al-doped layer 403 by performing the same method as the Al doping method B.

Further, the second TiO$_2$ film having a thickness of 1 nm was formed on the second ZrO$_2$ layer 404 by using the same method as above. The film formation from the first TiO$_2$ film to the second TiO$_2$ film was performed in the same reaction chamber, and a film forming temperature was 250° C.

Then, a TiN film was formed as an upper electrode to have a thickness of 8 nm by using a previously known CVD method. Subsequently, a boron-doped silicon germanium film (B-Site film) was formed at a temperature of 450° C. to have a thickness of 150 nm by using a previously known LP-CVD method, and the upper electrode was patterned by previously known lithography and dry etching. Then, a H$_2$ process was performed for two hours at a temperature of 450° C. by a heat load inevitable for a DRAM process.

Figure 8:
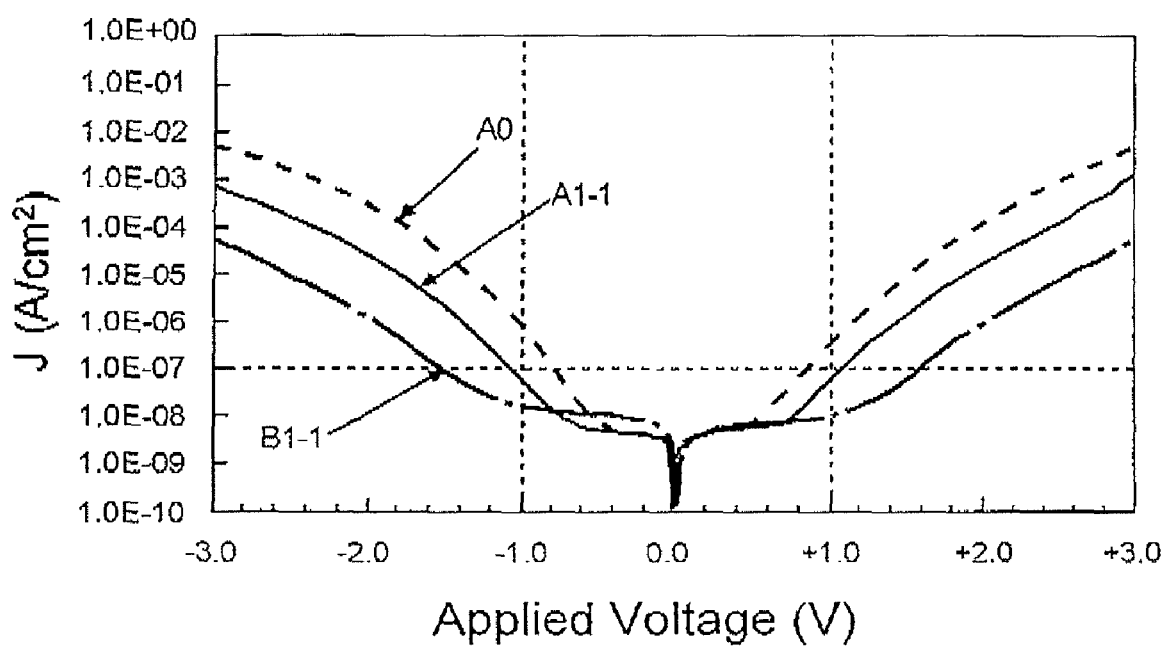
FIG. 8 is a graph showing I-V characteristics of manufactured capacitor samples.

FIG. 8 illustrates leakage current characteristics (I-V characteristics) of a capacitor sample of Al doping method A (no Al doping: A0, one layer in one Al doping cycle: A1-1) and a capacitor sample of Al doping method B (one layer in one Al doping cycle: B1-1). In FIG. 8, the Al concentration in the ZrO$_2$ dielectric film is B1-1>A1-1>A0 and I-V characteristics are B1-1>A1-1>A0 corresponding to the Al concentration. Meanwhile, EOT is A0 (0.66 nm)<A1-1 (0.79 nm)<B1-1 (1.01 nm).

Figure 9:
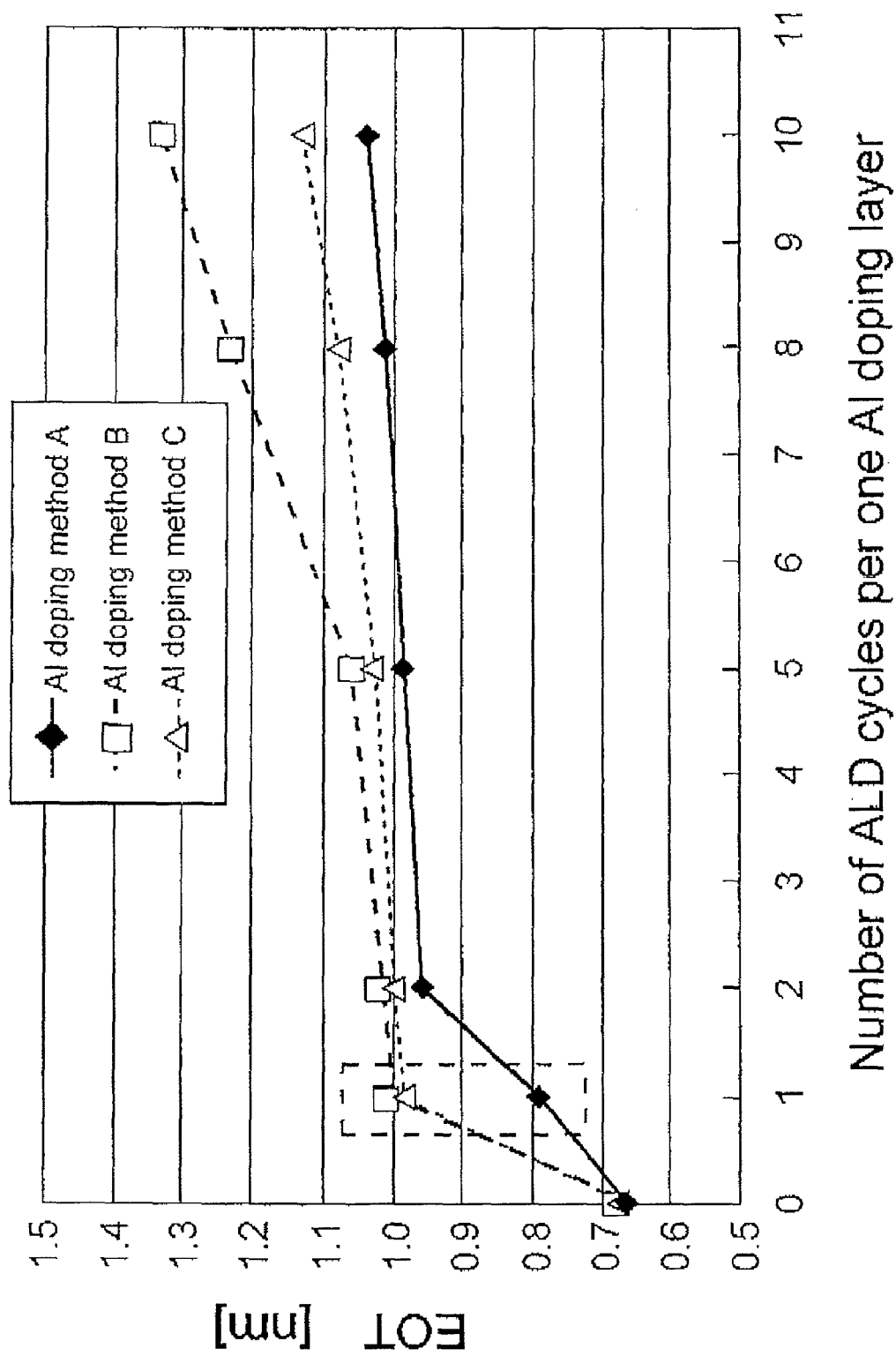
FIG. 9 is a graph showing a relationship between EOT and the number of ALD cycles per one Al doping layer of the manufactured capacitor samples.

FIG. 9 illustrates a relationship between EOT and the number of ALD cycles per one Al doping layer of the samples formed by the Al doping method A, the Al doping method B and the Al doping method C.

Figure 10:
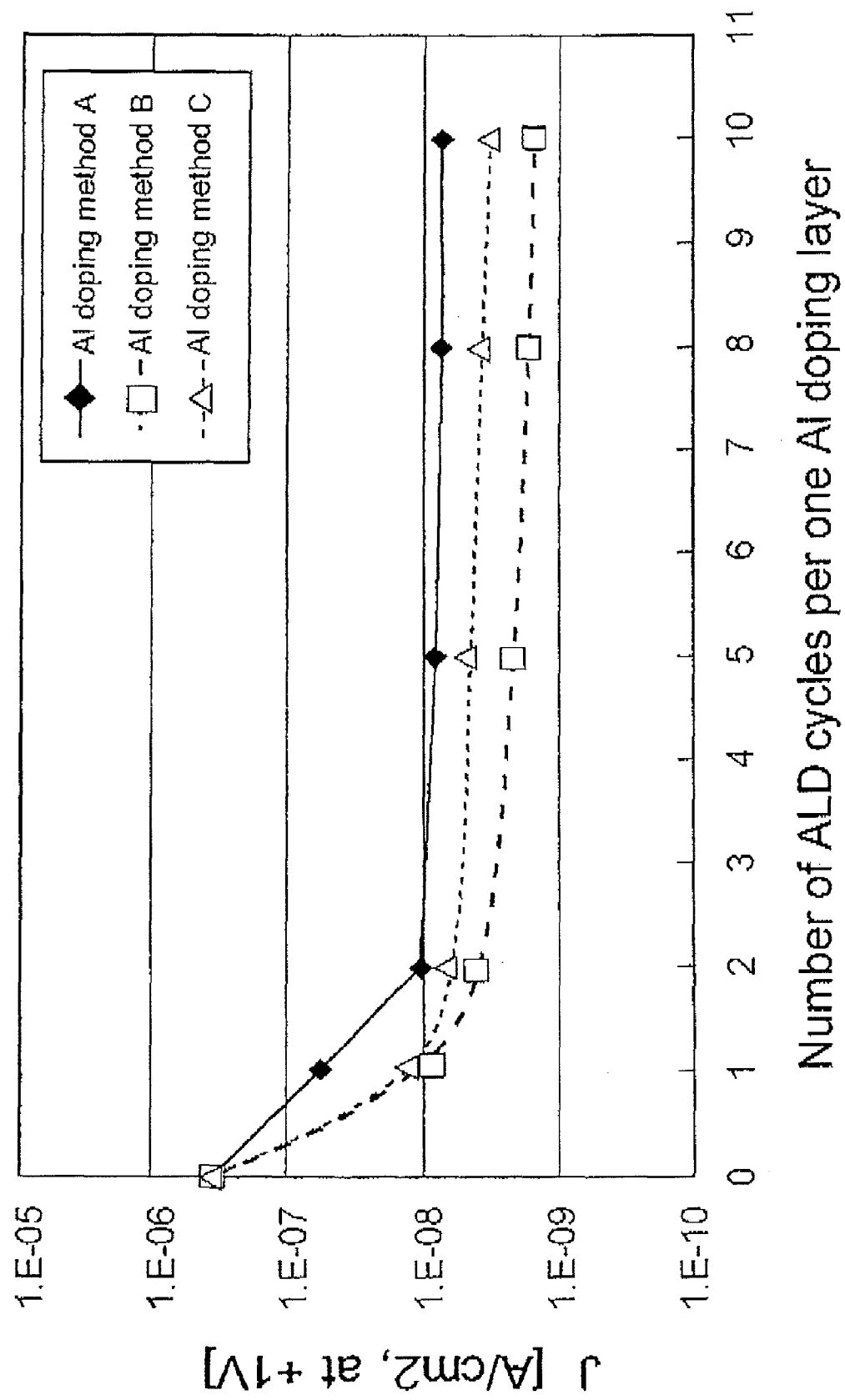
FIG. 10 is a graph showing a relationship between leakage current characteristics and the number of ALD cycles per one Al doping layer of the manufactured capacitor samples.

Further, FIG. 10 illustrates a relationship between leakage current (under direct current bias of +1V) and the number of ALD cycles per one Al doping layer of the samples formed by the Al doping method A, the Al doping method B and the Al doping method C. In this case, each value is obtained from the I-V characteristics as shown in FIG. 8.

Figure 11:
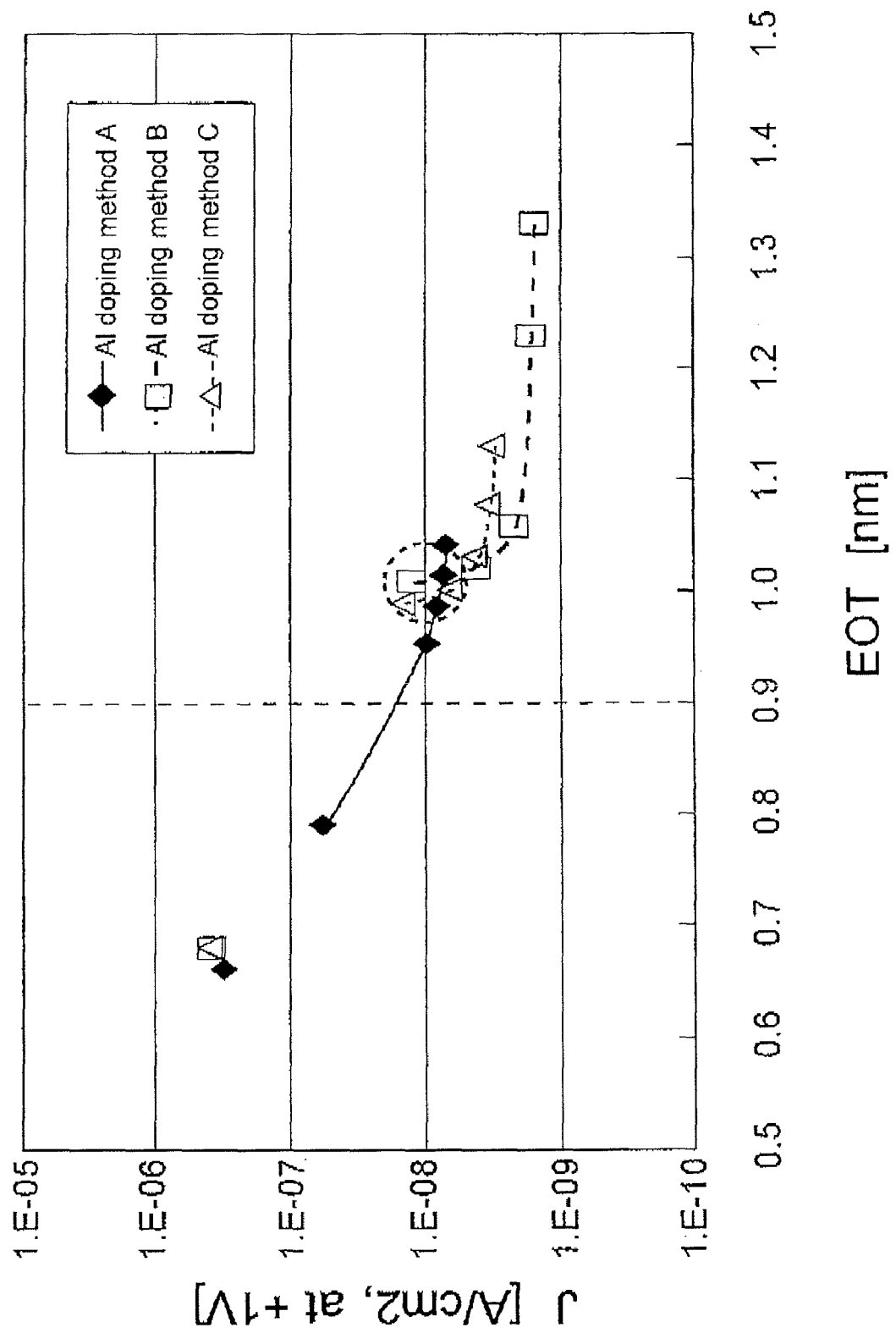
FIG. 11 is a graph showing a relationship between EOT and the leakage current characteristics of the manufactured capacitor samples.

Further, FIG. 11 illustrates a relationship between EOT and the leakage current of the samples formed by the Al doping method A, the Al doping method B and the Al doping method C.

Since the structure of each sample has the first and second TiO$_2$ films at the lower and upper sides, it is simply referred to as a TZAZT structure (except for no Al doping). Specifically, the film structure from the upper electrode to the lower electrode is as follows.

In a case where the number of Al-ALD cycles is zero, the same sample is obtained by the Al doping method B and Al doping method C since it is a TZT structure having the same Zr source, and a different sample is obtained by the Al doping method A since the Zr source is different at the 0th cycle.

The TZAZT structure includes the upper electrode TiN, the second TiO$_2$ (1 nm), the second ZrO$_2$ (3 nm), the Al-doped layer (1 to 10 ALD cycles), the first ZrO$_2$ (3 nm), the first TiO$_2$ (5 ALD cycles≈0.5 nm thick), and the lower electrode TiN. The number of ALD cycles of the Al-doped layer was changed from 1 to 10 (1, 2, 5, 8 and 10).

As seen from FIG. 9, a sample having the lowest EOT is a sample in which Al is not doped and the number of Al-ALD cycles is zero (sample of the TZT structure). However, in the TZT structure, as seen from FIG. 10, the leakage current was increased to exceed a target leakage current density 1E-7 [A/cm$^2$ at +1V].

In FIG. 9, a sample having the second lowest EOT behind the TZT (no Al doping) is a sample in which the number of ALD cycles of Al doping using the Al doping method A (method of the present invention) is 1 (FIG. 2), and the EOT is less than 0.8 nm. If the number of ALD cycles is 2, the EOT rapidly increases to be about 0.95 nm. After that, the EOT slowly increases until the number of ALD cycles is 10 in this case.

It can be seen that in case of the Al doping method B and the Al doping method C, the EOT is already increased to about 1 nm at one ALD cycle of Al doping. Thereafter, in case of the Al doping method B, the EOT was slowly increased until the number of ALD cycles of Al doping is 2 and 5, but further increased when the number of ALD cycles of Al doping is 8 and 10.

Further, in case of the Al doping method C, the EOT was slowly increased until the number of ALD cycles of Al doping is 8, but further increased when the number of ALD cycles of Al doping is 10 although increased by the smaller amount than that of Al doping method B.

Particularly, focusing on where the number of ALD cycles of Al doping is 1 in FIG. 9 (surrounded by a dashed line), it is considered that a difference in the increased amount of EOT in the respective doping methods is caused by a difference in the amount of Al adsorbed in one ALD cycle of Al doping.

That is, if the area density of Al atoms of the Al-doped layer exceeds a predetermined threshold value, crystal grains of the $ZrO_2$ film are separated and permittivity is reduced by size effects.

Then, it is considered that approximately constant EOT is exhibited until an $Al_2O_3$ film is formed by Al, and if the amount of Al atoms becomes a sufficient amount for the $Al_2O_3$ film (exceeding five cycles of the Al doping method B), the EOT begins to be increased.

The inventors have measured the area density of Al atoms of the Al-doped layer by using an inductively coupled plasma mass spectrometer (ICP-MS) for one layer at one cycle of Al doping and one layer at two cycles of Al doping of the Al doping methods A, B and C.

The results thereof are summarized in Table 1 (including a sample using MCTMAZ as a precursor and the Al doping method A (ICP-MS analysis sample No. 7)).

In the above examples, although the Al-doped layer was formed at an approximately central portion of the $ZrO_2$ film in a film thickness direction, it is not limited thereto, and the first and second $ZrO_2$ layers may be asymmetric in the film thickness by forming the Al-doped layer adjacent to the lower electrode or the upper electrode. However, at least, a film thickness of the sequentially formed $ZrO_2$ films is preferably equal to or greater than 0.5 nm, more preferably, equal to or greater than 1.0 nm. Further, a total film thickness of the first and second $ZrO_2$ layers preferably ranges from 5 to 8 nm. Further, herein, a first dielectric film (first $ZrO_2$ layer) means a film positioned on the lower electrode side with respect to the Al-doped layer, and a second dielectric film (second $ZrO_2$ layer) means a film positioned on the upper electrode side with respect to the Al-doped layer. For example, in case of introducing a plurality of Al-doped layers as described below, a dielectric film interposed between two Al-doped layers is becomes a second dielectric film with respect to a first dielectric film below a lower Al-doped layer, but becomes a first dielectric film with respect to a second dielectric film above an upper Al-doped layer.

TABLE 1

| ICP-MS analysis sample No. | Al doping method | Structure | Source gas Zr source | Source gas Al source | Al-doped layer Number of layers | Al-doped layer Number of ALD cycles for one layer | Al area density [atoms/cm$^2$] | Al/(Al + Zr) [atom %] (ZrO$_2$ film thickness of 6 nm) | EOT [nm] | J [A/cm$^2$] (at + 1 V) |
|---|---|---|---|---|---|---|---|---|---|---|
| 1 | A | TZAZT | CTMAZ | TMA | 1 | 1 | 7.1E+13 | 0.4% | 0.79 | 5.7E−08 |
| 2 | B | TZAZT | TEMAZ | TMA | 1 | 1 | 4.2E+14 | 2.3% | 1.01 | 1.2E−08 |
| 3 | C | TZAZT | TEMAZ | TMA | 1 | 1 | 2.3E+14 | 1.3% | 0.99 | 1.4E−08 |
| 4 | A | TZAZT | CTMAZ | TMA | 1 | 2 | 1.4E+14 | 0.8% | 0.96 | 1.0E−08 |
| 5 | B | TZAZT | TEMAZ | TMA | 1 | 2 | 8.8E+14 | 4.7% | 1.02 | 4.2E−09 |
| 6 | C | TZAZT | TEMAZ | TMA | 1 | 2 | 4.5E+14 | 2.5% | 1.00 | 6.5E−09 |
| 7 | A | TZAZT | MCTMAZ | TMA | 1 | 1 | 9.6E+13 | 0.5% | 0.80 | 1.3E−08 |

It can be seen that the amount of Al doped per one cycle in the Al doping method A is about one third (⅓) of that in the Al doping method C, and about one sixth (⅙) of that in the Al doping method B.

The EOT is maintained at 0.9 nm or less only for a sample in which the number of ALD cycles of Al doping of the Al doping method A is 1. Even in the Al doping method A, the EOT is close to 1 nm for a sample in which the number of ALD cycles of Al doping is 2. Accordingly, it is considered that the area density of Al doped by one ALD cycle ranges from 7.0E+13 to 1.4E+14 [atoms/cm$^2$], and the $ZrO_2$ film is divided at 1.4E+14 [atoms/cm$^2$] or more to exhibit the "size effects" explained above.

Further, in the Al doping method A in which the MCTMAZ (having a larger steric hindrance than the CTMAZ described previously) is used for the Zr source and blocker, in a sample (ICP-MS analysis sample No. 7) having one layer at one cycle of Al doping, since the area density of Al was 9.6E+13 [atoms/cm$^2$] and the EOT was 0.80 nm, it is considered that the "size effects" are not exhibited until the area density of Al reaches about 1.0E+14. That is, it is considered that the Al surface density at which the $ZrO_2$ film is completely divided ranges from about 1.0E+14 to 1.4E+14 [atoms/cm$^2$] (in case of a heat load of 500° C.).

Accordingly, it can be seen that in order that the $ZrO_2$ film is not divided at one ALD cycle of Al doping, the area density is set to be less than 1.4E+14 [atoms/cm$^2$], preferably, equal to or less than 1.0E+14 [atoms/cm$^2$].

Next, there has been tried a method of introducing a plurality of Al-doped layers in the $ZrO_2$ film by using the Al doping method A while maintaining a total thickness of the $ZrO_2$ film to be 6 nm.

That is, samples having the following structures were fabricated and evaluation of the electric characteristics was conducted. In the following, T represents $TiO_2$, Z represents $ZrO_2$, and A represents an Al doped layer. Also, actually, since a $ZrO_2$ film is formed as one A layer introduced, a total film thickness increases by about 0.1 nm.

(A0) No ALD cycle of Al doping:
Upper TiN electrode/T (1 nm)/Z (6 nm)/T (0.5 nm)/lower TiN electrode (A1) One layer for one ALD cycle of Al doping:
Upper TiN electrode/T (1 nm)/Z (3 nm)/A/Z (3 nm)/T (0.5 nm)/lower TiN electrode (A2) Two layers for one ALD cycle of Al doping:
Upper TiN electrode/T (1 nm)/Z (2 nm)/A/Z (2 nm)/A/Z (2 nm)/T (0.5 nm)/lower TiN electrode (A3) Three layers for one ALD cycle of Al doping:
Upper TiN electrode/T (1 nm)/Z (1.5 nm)/A/Z (1.5 nm)/A/Z (1.5 nm)/A/Z (1.5 nm)/T (0.5 nm)/lower TiN electrode (A4) Four layers for one ALD cycle of Al doping:
Upper TiN electrode/T (1 nm)/Z (1.2 nm)/A/Z (1.2 nm)/A/Z (1.2 nm)/A/Z (1.2 nm)/A/Z (1.2 nm)/T (0.5 nm)/lower TiN electrode In the same way, the other samples were fabricated until a sample having six Al-doped layers (A6) is fabricated.

Figure 12:
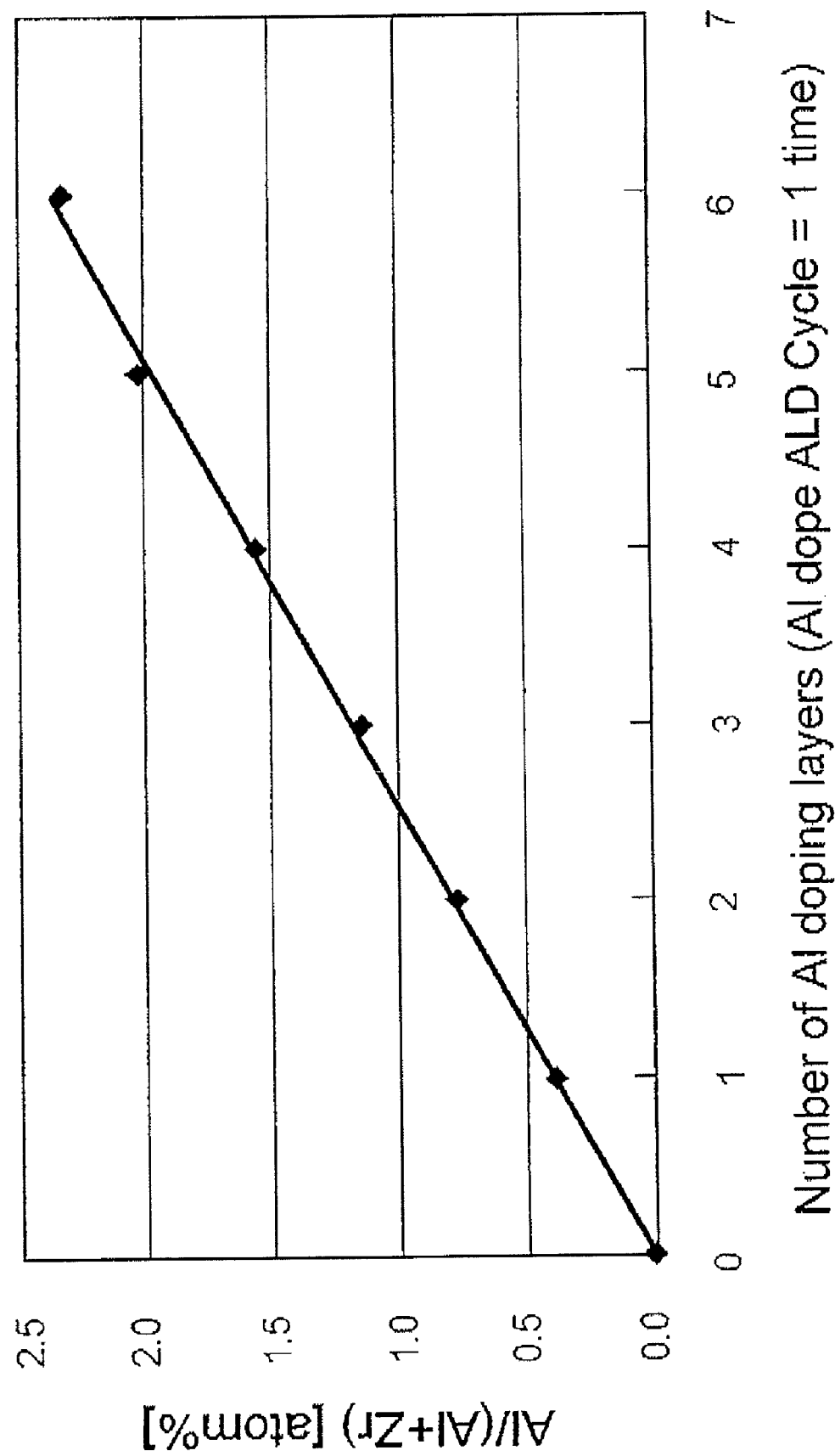
FIG. 12 is a graph showing a graph showing a relationship between the number of Al-doped layers and Al concentration.

FIG. 12 illustrates a graph of plotting the number of Al-doped layers and Al concentration (ratio of the number of Al atoms to the sum of metal atoms Zr and Al (Al/(Al+Zr) [atom %]). It can be seen that they have an appropriately linear relationship.

Figure 13:
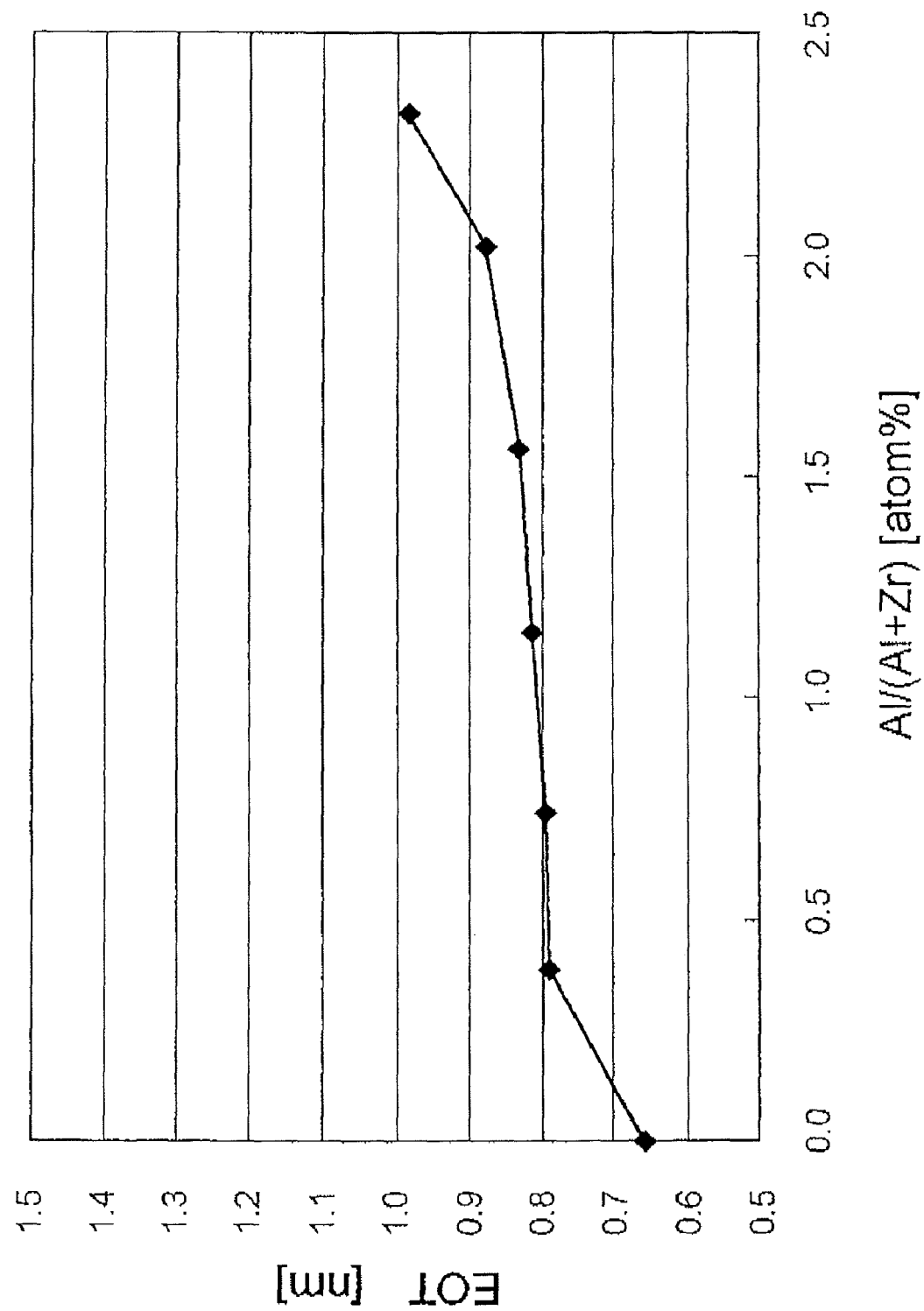
FIG. 13 is a graph showing a relationship between the Al concentration and EOT.

FIG. 13 illustrates a graph wherein the Al concentration obtained in FIG. 12 is plotted along a horizontal axis, and EOT is plotted along a vertical axis. It can be seen that the EOT slowly increases until Al/(Al+Zr) becomes 2 atom %, but rapidly increases after Al/(Al+Zr) exceeds 2 atom %. From these data, it is considered that although the area density of Al atoms for one Al-doped layer is less than 1E+14 [atoms/cm$^2$], if the Al/(Al+Zr) exceeds 2 atom %, growth of crystal grains begins to be suppressed.

Figure 14:
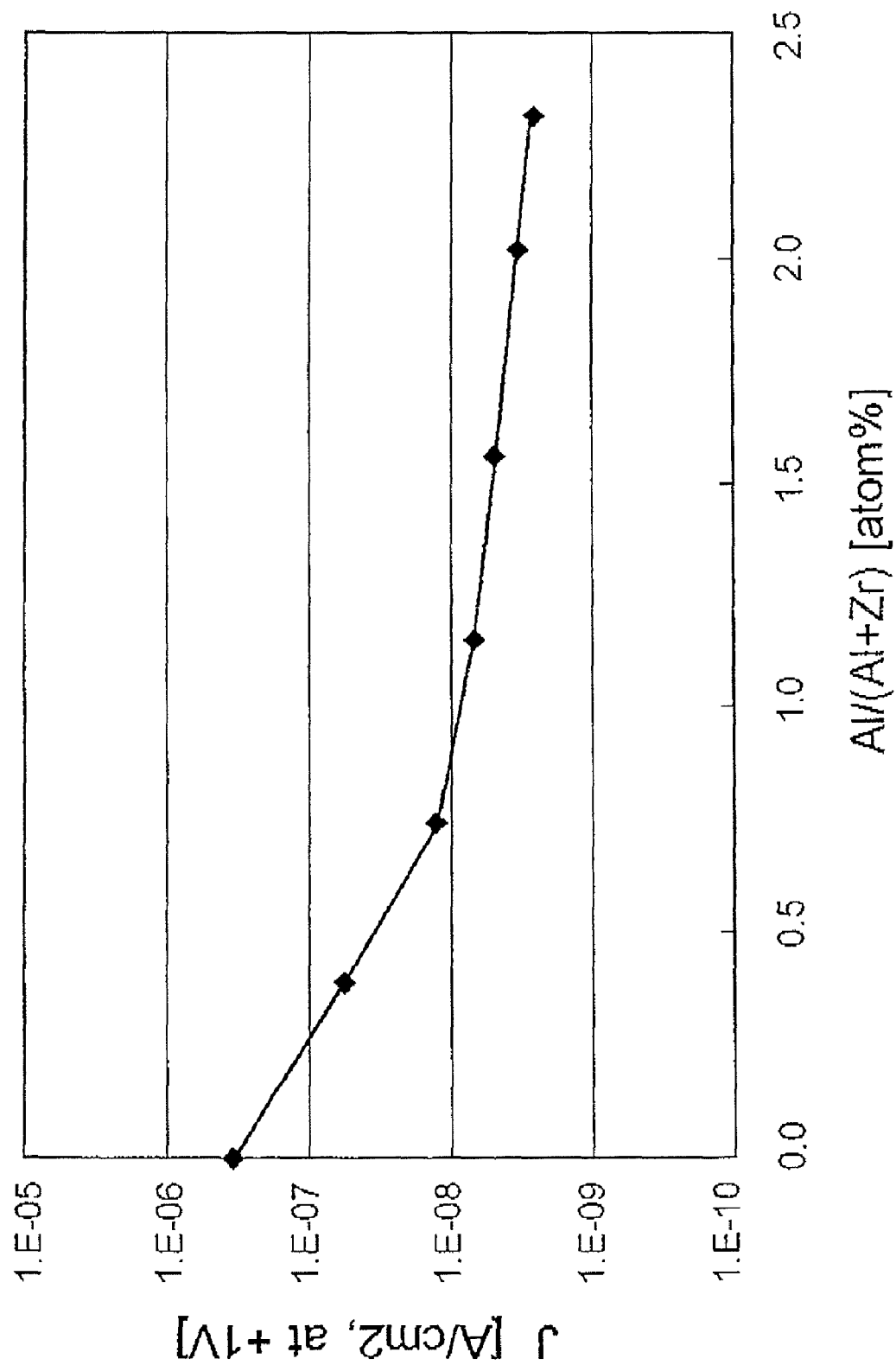
FIG. 14 is a graph showing a relationship between leakage current characteristics and Al concentration.

FIG. 14 illustrates a relationship between leakage current and Al concentration. It can be seen that as the Al concentration increases, the leakage current decreases.

Figure 15:
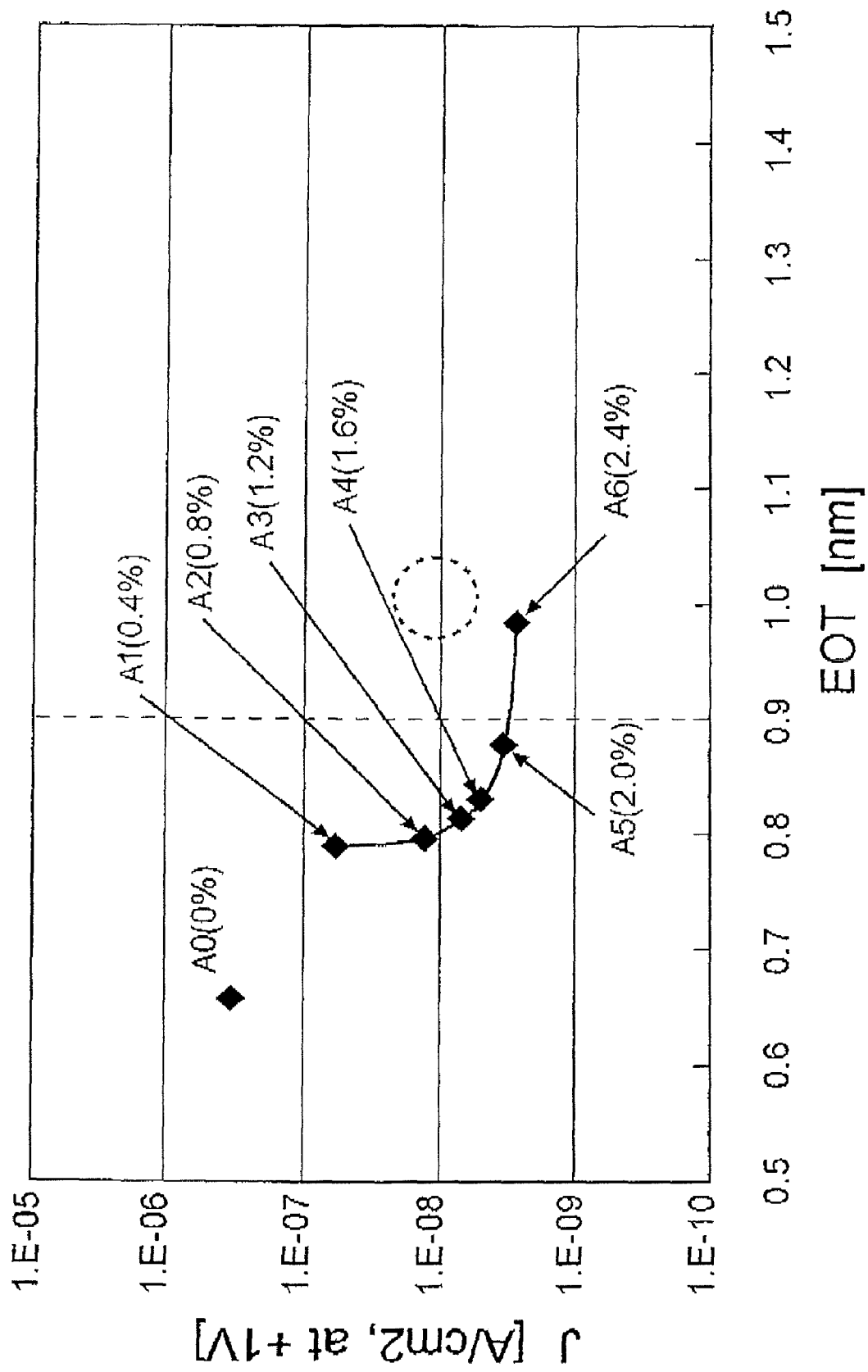
FIG. 15 is a graph showing a relationship between leakage current characteristics and EOT depending on the Al concentration.

FIG. 15 illustrates a relationship between leakage current and EOT. In FIG. 15, a portion surrounded by a broken-line circle represents a portion surrounded by a broken-line circle in FIG. 11 (range achievable by the Al doping methods B and C), A0 to A6 represent the above-mentioned sample No. (numeral is the number of layers), and the Al concentration (atom %) is represented in parentheses. It can be seen that it is possible to achieve the same leakage current with EOT smaller than that of the conventional technology (surrounded by dashed circle) by using the technology of the present invention.

Further, in the above examples, although the ALD film forming temperature was 250° C. in the same way as the conventional technology for comparison, in the CTMAZ and MCTMAZ of the Zr source and blocker used in the present invention, since the film formation can be stably achieved at a higher temperature, the smaller EOT can be obtained.

Another embodiment of the present invention (application to a capacitor having a steno structure)

In this embodiment, a semiconductor device which is applied to a capacitor having a steric structure and an aspect ratio of 20 or more by using the method of the present invention will be described with reference to FIGS. 16 to 18.

First, a configuration of a DRAM serving as a semiconductor storage device will be described with reference to a cross-sectional view of FIG. 16.

n-Well 1202 is formed on p-type silicone substrate 1201, and first p-well 1203 is formed within n-well 1202. Second p-well 1204 is formed on the region with the exclusion of n-well 1202, and is separated from first p-well 1203 by element isolation area 1205. First p-well 1203 and second p-well 1204 conveniently represent, respectively, memory cell region where a plurality of memory cells is arranged and peripheral circuit region.

First p-well 1203 has switching transistors 1206 and 1207 including gate electrodes which are to be word lines with components of each memory cell. Transistor 1206 includes drain 1208, source 2109, and gate electrode 1211 with gate insulation film 1210 inserted therebetween. Gate electrode 1211 has a polycide structure in which tungsten silicide is stacked on polycrystalline silicon, or a polymetal structure in which tungsten is stacked on polycrystalline silicon.

Transistor 1207 includes common source 1209, drain 1212, and gate electrode 1211 with gate insulation film 1210 inserted therebetween. The transistor is covered by first interlayer insulation film 1213.

To be connected to source 1209, a contact hole installed on a certain area of first interlayer insulation film 1213 is filled with polycrystalline silicone 1214. Metallic silicide 1215 is provided on the surface of polycrystalline silicone 1214. Bit line 1216 made of tungsten nitride and tungsten is provided to be connected to metallic silicide 1215. Bit line 1216 is covered by second interlayer insulation film 1219.

For the connection to drains 1208 and 1212 of the transistors, contact holes are formed on a certain area of the first and second interlayer insulation films 1213 and 1219, and each contact hole is filled with silicone to provide silicone plug 1220. Conductive plug 1221 made of metal is provided on the top of silicone plug 1220.

A capacitor is formed to be connected to conductive plug 1221. Third interlayer insulation film 1222a and fourth interlayer insulation film 1222b, which are to form lower electrodes, are stacked on second interlayer insulation film 1219. Fourth interlayer insulation film 1222b is reserved on the peripheral circuit region, and lower electrodes 1223 are formed in a crown shape on the memory cell region. Then, fourth interlayer insulation film 1222b on the memory cell region is eliminated. The capacitor is configured to have dielectric film 1224 which covers the outer wall exposed by removing fourth interlayer insulation film 1222b and the inner wall of lower electrode 1223, and upper electrode 1225 which covers the entire memory cell area. Support film 1222c is provided on a portion of the side of the top portion of lower electrode 1223. Support film 1222c is to connect some of a plurality of the adjacent lower electrodes, and thus to increase its mechanical strength and avoid the collapse of the lower electrodes themselves. Because there is a space below support film 1222c, dielectric film 1224 and upper electrode 1225 are also provided on the surface of the lower electrodes exposed to the space. FIG. 16 depicts two capacitors 1301 and 1302. Lower electrode 1223 is made of titanium nitride (TiN) formed by a CVD, which has an outstanding step coverage. The capacitor is covered by fifth interlayer insulation film 1226. The material for the plugs is changeable depending on the lower electrode of the capacitor; the material for the plugs is not limited to silicone, but can be made of the same material as the lower electrode of the capacitor or of a different material. The structure of dielectric film 1224 and upper electrode 1225 is described in detail with a manufacturing process later.

A transistor, which constitutes a peripheral circuit, includes source 1209, drain 1212, gate insulation film 1210, and gate electrode 1211 on second p-well 1204. A contact hole which is installed in a certain area of first interlayer insulation film 1213 is filled with metallic silicide 1216 and tungsten plug 1217 so that the hole is connected to drain 1212. First wiring layer 1218 which is made of tungsten nitride and tungsten is provided to be connected to tungsten plug 1217. A part of first wiring layer 1218 is connected metallic via plug 1227 to second wiring layer 1230 made of aluminum or copper. Metallic via plug 1227 is configured to penetrate second interlayer insulation film 1219, third interlayer insulation film 1222a, fourth interlayer insulation film 1222b and fifth interlayer insulation film 1226. Upper electrode 1225 of the capacitor arranged in the memory cell region is withdrawn as wiring 1228 from a certain area to the peripheral circuit region, and is connected to second wiring layer 1230 made of aluminum or copper by intervening metallic plug 1229 formed in a certain area of fifth interlayer insulation film 1226. DRAM is developed by repeating the steps, as necessary, of forming interlayer insulation films, forming contacts, and forming wiring layers.

Figure 16:
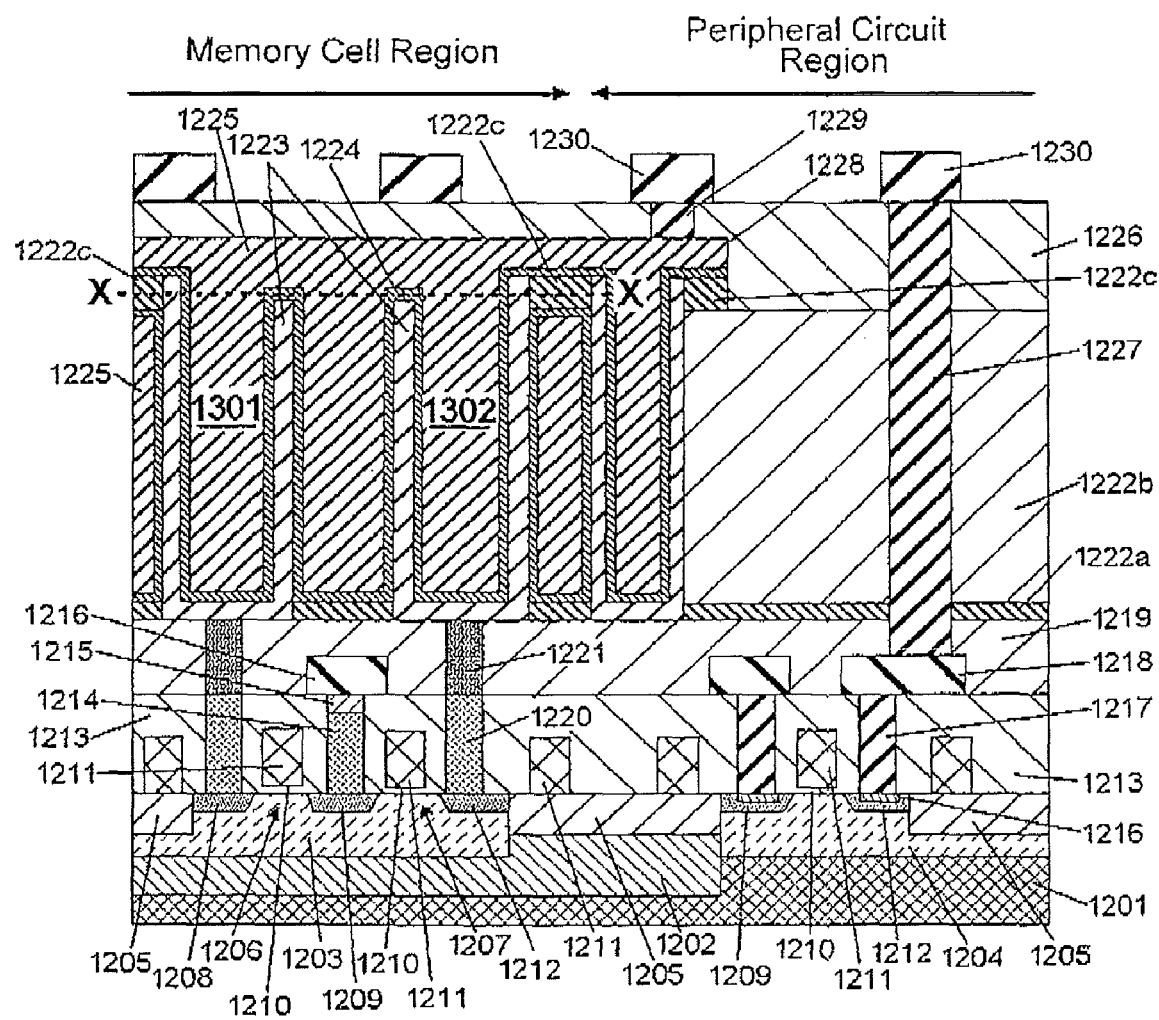
FIG. 16 schematically shows an entire configuration of a DRAM as a semiconductor device in accordance with the present invention.
Figure 17:
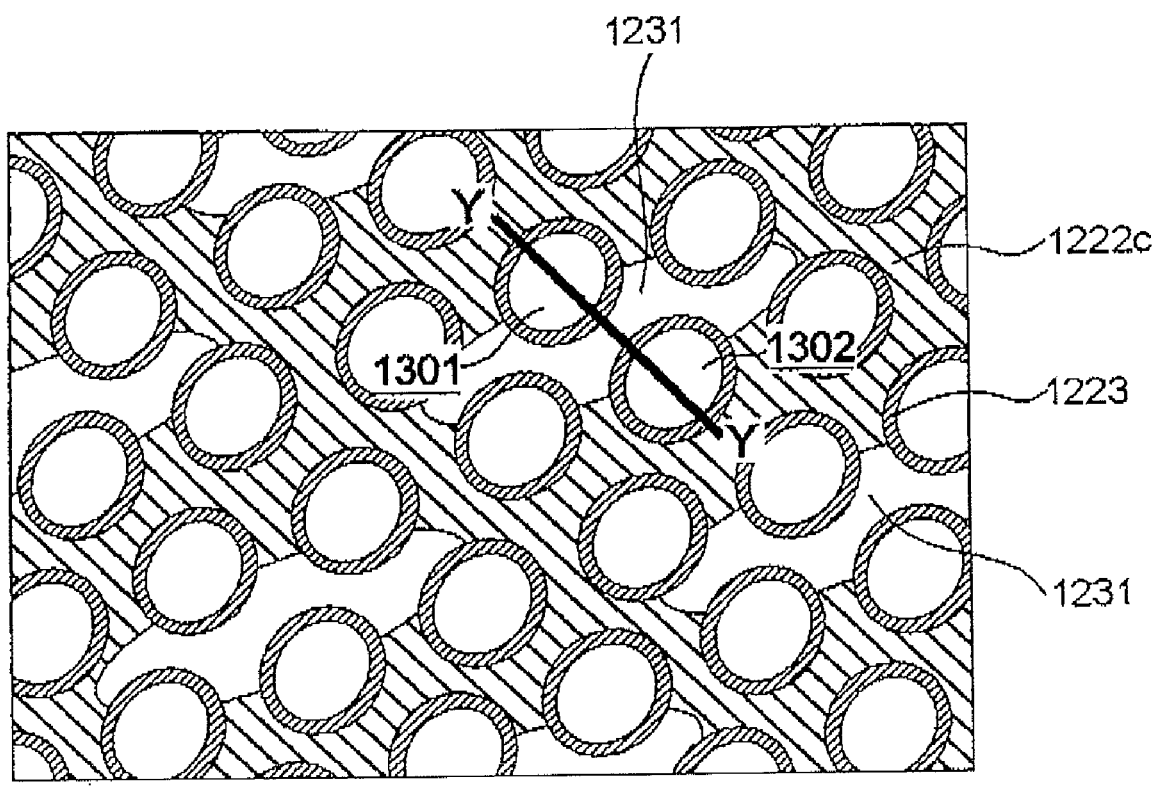
FIG. 17 schematically shows a plan view taken along line X-X of FIG. 16.

FIG. 17 is a schematic plane view of FIG. 16 taken along line X-X, excluding the dielectric film and the upper electrode. The line Y-Y in FIG. 17 corresponds to the line X-X in FIG. 16. Support film 1222c, which covers the entire outside of each lower electrode 1223, includes a plurality of openings 1231 over the entire memory cell region in a way of extending over a plurality of the lower electrodes. Each lower electrode 1223 is so configured that part of its circumference is in contact with any one of openings 1231. The support film with the exclusion of the openings is continuously configured so that the lower electrodes are connected to each other via the support film. The support film also helps avoiding the collapse of the lower electrodes themselves because the film may relatively extend the horizontal length with respect to the aspect ratio, i.e., the vertical/horizontal ratio. When cells are miniaturized with a high degree of integration, the aspect ratio, i.e., the vertical/horizontal ratio, of the lower electrode of the capacitor increases, and would thus cause the collapse of the lower electrode during its manufacturing without a means to support the lower electrode. FIG. 17 shows an example of opening 1231 overlapping six lower electrodes with a central focus on an area between capacitors 1301 and 1302. Therefore, in FIG. 16, the upper portions of capacitors 1301 and 1302 and of an area between the capacitors 1301 and 1302, which correspond to the areas in FIG. 17, are configured to have no support film.

As such, with the support film prepared, a better film forming method with a better coverage is required to form a dielectric film and an upper electrode on the surface of the lower electrode below the support film.

A process for manufacturing a capacitor according to the invention is now described with the exclusion of the other processes in a method of manufacturing DRAM as the semiconductor memory device described above. FIGS. 18(*a*) to 18(*i*) are cross-sectional views of a process for manufacturing one capacitor depicted in FIG. 16. For clarity, a transistor or a first interlayer insulation film on semiconductor substrate 1201 is omitted.

First, as shown in FIG. 18(*a*), second interlayer insulation film 1219 is formed on semiconductor substrate 1201 made of monocrystal silicon. Then, a contact hole is formed on a predetermined location, and barrier metal film 1221*a* and metal film 1221*b* are formed on the entire surface. Then, barrier metal film 1221*a* and metal film 1221*b*, which have been formed on the second interlayer insulation film is removed by a CMP method to form conductive plug 1221. Then, third interlayer insulation film 1222*a* made of a silicon nitride film, fourth interlayer insulation film 1222*b* made of a silicon oxide film, and support film 1222*c* made of a silicon nitride film are formed on the entire surface.

Then, as shown in FIG. 18(*b*), cylinder hole 1232 is formed in support film 1222*c*, fourth interlayer insulation film 1222*b* and third interlayer insulation film 1222*a* by lithography and dry etching. The cylinder hole has a circular plane profile having a diameter of 60 nm. The closest distance from the adjacent cylinder hole is 60 nm. As such, the bottom surface of the cylinder hole is exposed to the top surface of conductive plug 1221.

Then, as shown in FIG. 18(*c*), TiN film 1223*a*, which is the material of the lower electrode of the capacitor, is formed on the entire surface including the inner surface of cylinder hole 1232. The TiN film can be formed by a CVD method with source gases of TiCl$_4$ and NH$_3$ at a forming temperature between 380° C. to 650° C. The forming temperature is 450° C. and the film thickness is 10 nm in this embodiment. Alternatively, the TiN film can also be formed by an ALD method using the same source gases. The formation of TiN film 1223*a* defines new cylinder hole 1232*a*. The TiN film was formed such that a film thickness at a sidewall of the hole ranges from 5 nm to 15 nm.

Then, as shown in FIG. 18(*d*), protective film 1234 such as a silicon oxide film is formed on the entire surface to fill up cylinder hole 1232*a*. Then, TiN film 1223*a* and the protective film 1234 formed on the top surface of the support film 1222*c* are removed by a CMP or dry etching method to form lower electrode 1223.

Then, opening 1231 is formed in support film 1222*c* (see FIG. 18(*e*)). As illustrated in the plane view of FIG. 17, the pattern of opening 1231 overlaps with a part of fourth interlayer insulation film 1222*b*, a part of lower electrode 1223, and a part of protective film 1234 remaining in the inside of the lower electrode. Therefore, dry-etching for forming opening 1231 removes a portion of the top of lower electrode 1223 and the protective film 1234 as well as the support film 1222*c* formed on fourth interlayer insulation film 1222*b*.

Then, as shown in FIG. 18(*f*), fourth interlayer insulation film 1222*b* exposed in opening 1231 is removed. For example, an etching process using hydrofluoric acid solution (HF solution) does not substantially etch support film 1222*c* because support film 1222*c* is made of a silicon nitride film, but removes all of protective film 1234 and fourth interlayer insulation film 1222*b* formed with a silicon oxide film.

Besides the area right under opening 1231, the silicon oxide film below support film 1222*c* is also removed because the etching uses a solution. Accordingly, lower electrode 1223 and support film 1222*c* supporting lower electrode 1223 remains hollow, and lower electrode 1223 exposes its surface.

During this etching process, third interlayer insulation film 1222*a* made of a silicon nitride film functions as an etching stopper, preventing second interlayer insulation film 1219 from being etched.

Then, as shown in FIG. 18(*g*), dielectric film 1224 is formed. Dielectric film 1224 was formed, in the same way as the fabrication of a capacitor sample of the Al doping method A in accordance with the embodiment of the present invention, by sequentially forming a first TiO$_2$ film, a first ZrO$_2$ layer, an Al doped layer (one cycle of ALD sequence of Al doping using CTMAZ) and a second ZrO$_2$ layer from the lower electrode side, and additionally, second TiO$_2$ film 1225*a* was formed thereon. Since a film formed using an ALD method has excellent step coverage, dielectric film 1224 and second TiO$_2$ film 1225*a* were formed on any part of the surface of the lower electrode exposed in a hollow state. Second TiO$_2$ film 1225*a* is amorphous in the film formation of the ALD method, but is crystallized into polycrystalline by being heated in a subsequent process to function as a conductor. Accordingly, after thermal treatment in a subsequent process, it can be called a first upper electrode. Further, dielectric film 1224 is not limited to the above example, and can be obtained by forming a first ZrO$_2$ layer on a lower electrode without forming a first TiO$_2$ film, or forming a plurality of Al-doped layers (having Al concentration of 0.5 to 2 atom %). Further, second TiO$_2$ film 1225*a* can be omitted.

Meanwhile, in the second p well 1204, there is provided a transistor forming a peripheral circuit includes the source 1209, the drain 1212, the gate insulating film 1210, and the gate electrode 1211. The contact hole provided in a specific region of the first interlayer insulating film 1213 to be connected to the drain 1212 is filled with metal silicide 1216 and tungsten 1217. A first wiring layer 1218 formed of tungsten nitride and tungsten is provided to be connected to the tungsten 1217. A portion of the first wiring layer 1218 is connected to a second wiring layer 1230 formed of aluminum or copper via a metal via plug 1227 provided through the second interlayer insulating film 1219, the third interlayer insulating film 1222*a*, the fourth interlayer insulating film 1222*b*, and the fifth interlayer insulating film 1226. Further, the upper electrode 1225 of the capacitor provided in the memory cell region is extracted to the peripheral circuit region by a lead wire 1228, and connected to the second wiring layer 1230 formed of aluminum or copper via a metal plug 1229 formed in a specific region of the fifth interlayer insulating film 1226. The formation of an interlayer insulating film, formation of a contact, and formation of a wiring layer are repeated as desired to form a DRAM.

FIG. 17 schematically shows a plan view taken along line X-X of FIG. 16, wherein the dielectric film and the upper electrode are omitted. Further, a region represented by line Y-Y of FIG. 17 corresponds to a region represented by ling X-X of FIG. 16. A plurality of openings 1231 are formed on the support film 1222c covering the outer entire region of the lower electrode 1223 over the memory cell region to straddle a plurality of lower electrodes. The lower electrode 1223 is configured such that a portion of its periphery is in contact with any one of the openings 1231. Since the support film other than the openings is continuous, the lower electrodes are connected to each other through the support film and a horizontal length of an aspect ratio can be extended, thereby avoiding collapse of the lower electrodes. If the cell is miniaturized due to high integration density, an aspect ratio of the lower electrode of the capacitor increases. If there is no means for supporting the lower electrode, the lower electrode can collapse during the manufacture. FIG. 17 illustrates an example in which the opening 1231 is formed to straddle six lower electrodes in a region between the capacitors 1301 and 1302 facing each other. Accordingly, also in FIG. 16 corresponding to FIG. 17, the support film is not formed at an upper portion of the capacitor 1301, an upper portion of the capacitor 1302, and an upper portion between the capacitors 1301 and 1302.

By forming the support film as described above, in order to form the upper electrode or the dielectric film on the surface of the lower electrode below the support film, a film formation method with more excellent coverage is required.

Hereinafter, there will be described a process of manufacturing a capacitor in accordance with the embodiment of the present invention while omitting the other processes in the manufacture of a DRAM serving as the semiconductor storage device. FIGS. 18A to 18I illustrate a cross-sectional view showing a process for one capacitor shown in FIG. 16. Further, for explanation, the first interlayer insulating film and the transistors on the semiconductor substrate 1201 and the like are omitted.

Figure 18A:
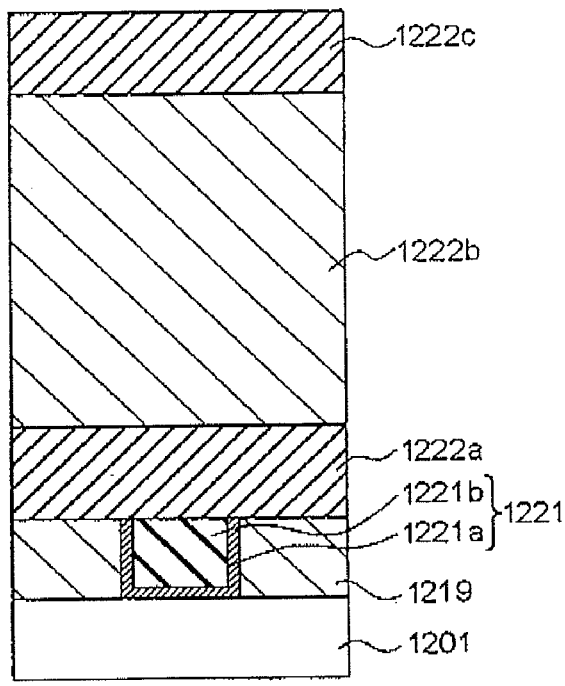
FIGS. 18(a) to 18(i) are cross-sectional views showing the steps of a process for manufacturing a capacitor of FIG. 16.
Figure 18B:
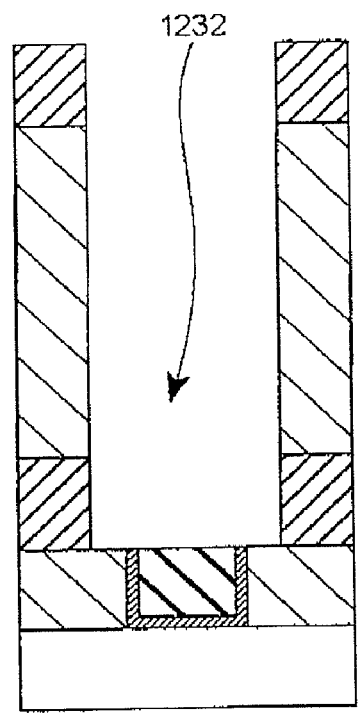
Figure 18C:
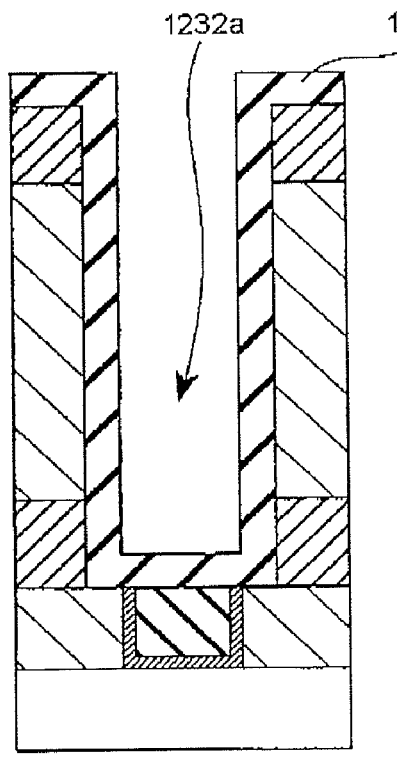
Figure 18D:
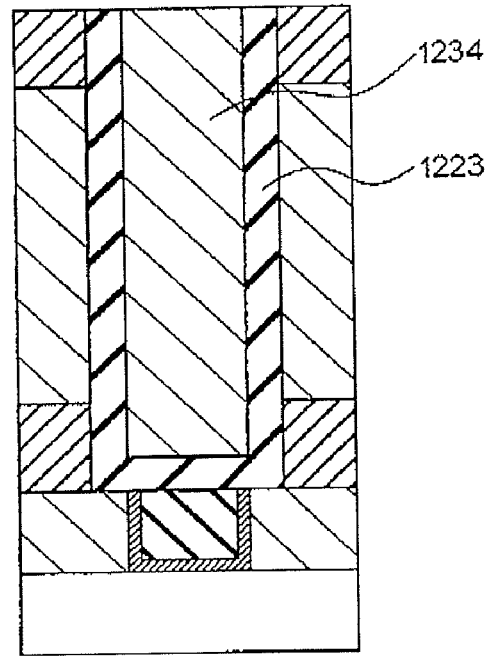
Figure 18E:
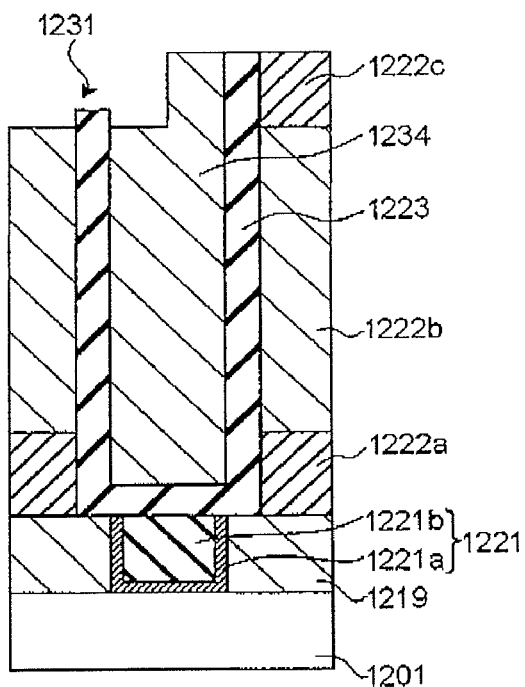
Figure 18F:
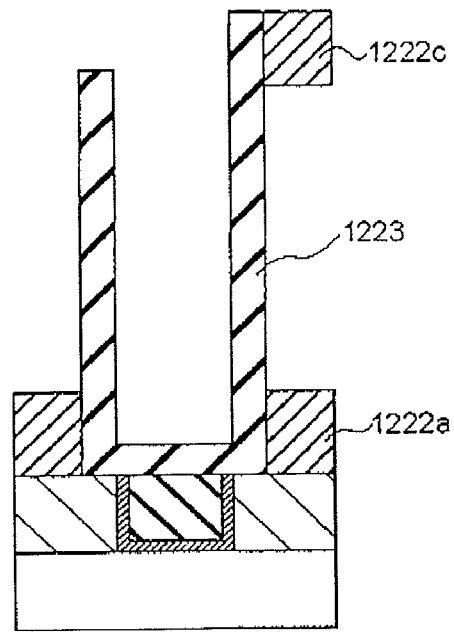
Figure 18G:
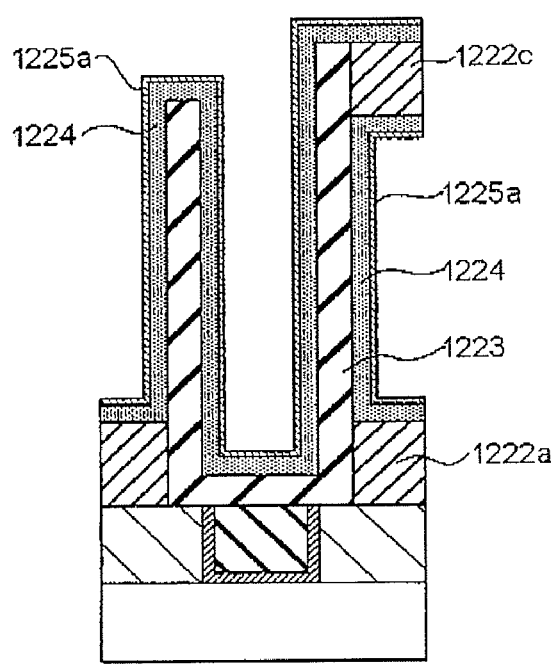
Figure 18H:
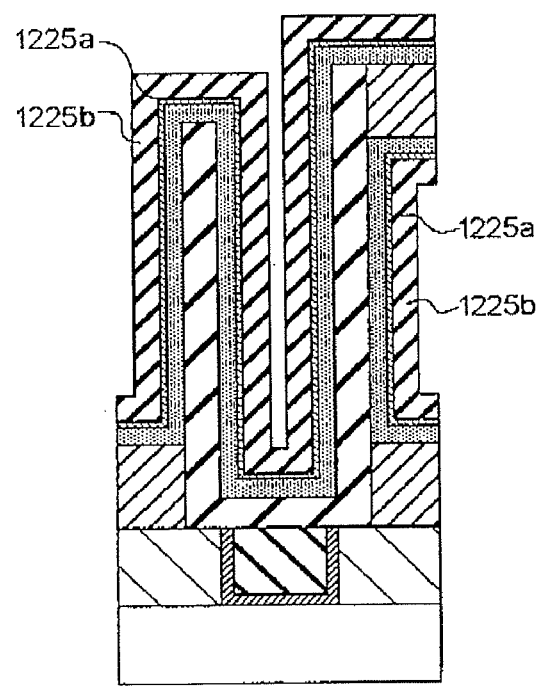

Then, as shown in FIG. 18(h), a TiN film to be second upper electrode 1225b was formed. In the same way as the lower electrode, the TiN film was formed at a temperature of 450° C. by a CVD method using $TiCl_4$ and $NH_3$ as a source, and had a film thickness of 10 nm. Since the TiN film formed by a CVD method has very good step coverage, it may enter a hollow space and be formed on any part of the surface of second $TiO_2$ film 1225a.

The dielectric film formed by the ALD method becomes denser in the step of forming second upper electrode 1225b at a temperature of 450° C. and becomes dielectric film 1224 with reduced permittivity.

Figure 18I:
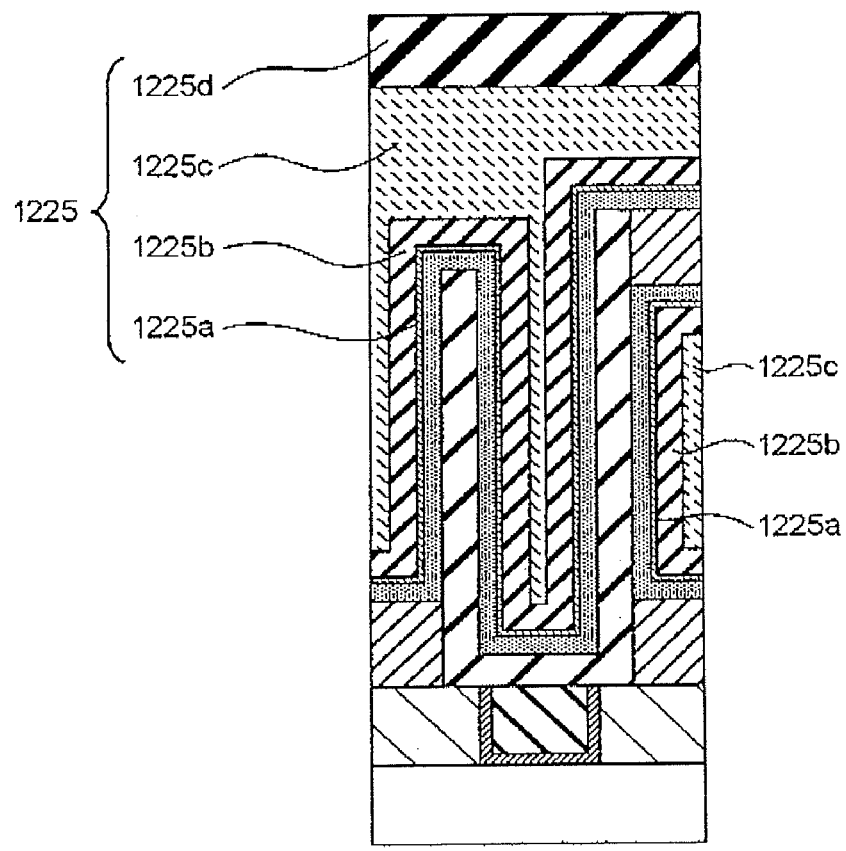

Then, as shown in FIG. 18(i), a boron-doped silicon germanium film (B-SiGe film) to be third upper electrode 1225c was formed. In FIG. 18(h) of forming second upper electrode 1225b, a space remains without eliminating the hollow state. In this state, when tungsten to be plate electrode 1225d is formed by a PVD method, since the PVD method has poor step coverage, it is difficult to fill up the space. Accordingly, even after the semiconductor device is completed, a space remains around a capacitor, which causes a reduction in mechanical strength, and a variation in the characteristics of a capacitor due to stress generated in packaging of a subsequent process. Accordingly, the B-SiGe film is formed to fill up the remaining space and remove the space, thereby improving resistance to mechanical stress.

The B-SiGe film can be formed by a CVD method using germane ($GeH_4$), monosilane ($SiH_4$) and boron trichloride ($BCl_3$) as a source. The B-SiGe film formed by this method has excellent step coverage to thereby fill up a hollow space.

After forming the B-SiGe film to be third upper electrode 1225c, a tungsten film (W film) to be fourth upper electrode 1225d was formed in order to be used as a power feed plate covering the entire memory cell region. The W film can be formed by a PVD method at a temperature of 25 to 300° C. The first upper electrode (second $TiO_2$ film 1225a) to fourth upper electrode 1225d are collectively referred to as upper electrode 1225 of FIG. 16. Hereinafter, as shown in FIG. 16, a semiconductor device formed of a DRAM is manufactured by performing the step of forming fifth interlayer insulating film 1226 and a subsequent process.

Further, a configuration and manufacturing method of a high-density advanced DRAM have been described in this embodiment. If structural reinforcement is unnecessary even though it is a steno structure, the step of forming the B-SiGe film is unnecessary.

As described above, a cylindrical capacitor of F32 nm level was manufactured and a capacitor having a capacitance of 20 fF/cell was obtained as a capacitor having a cylinder height of 1800 nm, an outer diameter of a lower electrode of 53 nm, and an aspect ratio of 34.

In this case, it has been found by TEM measurement that the coverage of the Al-doped $ZrO_2$ film is about 95%.

<<Al Doping in $TiO_2$ Dielectric Film>>

It is possible to obtain a dielectric film having EOT of about 0.8 nm as an Al-doped $ZrO_2$ film by using the technology of the present invention.

However, in a DRAM since F30 nm level, a dielectric film having a smaller EOT is required. A review of using a $TiO_2$ film having a rutile crystal phase as the dielectric film has been conducted.

$TiO_2$ may have a plurality of crystal structures such as anatase, rutile and brookite. Among them, a crystal structure having the highest permittivity is a rutile structure.

Further, in a case where $TiO_2$ is used as a dielectric film of a capacitor in combination with a TiN electrode, it is impossible to achieve a sufficient band offset (due to a small Schottky barrier), and it results in leaky characteristics in Schottky current.

Accordingly, $RuO_2$ or the like is expected as a material having a large work function (sufficient band offset) and a template function for converting an electrode into rutile.

Further, it is known that a method for adding Al to the dielectric $TiO_2$ film is effective to reduce heat resistance or leakage.

Figure 19:
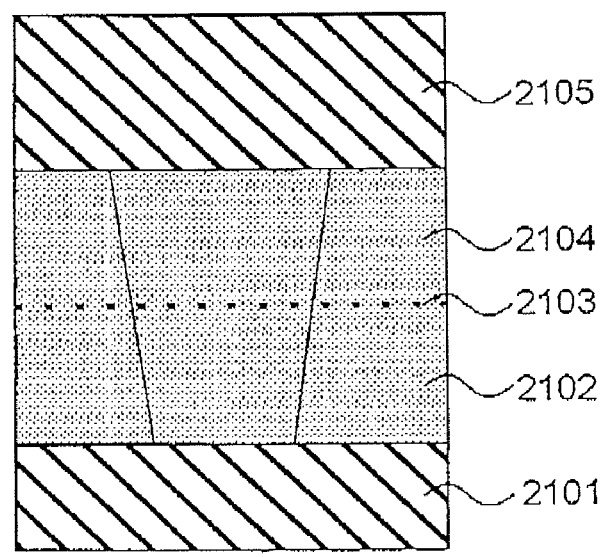
FIG. 19 schematically shows a cross-sectional view of a structure of a capacitor in accordance with another embodiment of the present invention.

FIG. 19 schematically shows a cross-sectional view of a structure of a capacitor using $TiO_2$ as a dielectric film. Lower electrode 2101 can be formed using a material including $RuO_2$ or the like as a surface layer, and in this case, a $RuO_2$ film. First $TiO_2$ layer 2102 as a first dielectric film, Al-doped layer 2103, and second $TiO_2$ layer 2104 as a second dielectric film were sequentially formed on lower electrode 2101 by the ALD method. Upper electrode 2105 (in this case, a $RuO_2$ film in the same way as the lower electrode) was formed on second $TiO_2$ layer 2104. As the lower electrode, a laminated film in which $RuO_2$ or the like is laminated on another conductive material can be used. $RuO_2$ or the like may be also formed by a CVD method or ALD method with good coverage.

It can be seen that when Al is doped by using a conventional technique (Al doping method B or C), crystal grains are separated in the same way as the $ZrO_2$ film, a template function for converting an electrode into rutile is terminated at the Al-doped layer, and TiO$_2$ grown thereon is liable to be acetase.

By applying the method of the present invention, it is possible to dope Al without separating TiO$_2$ crystal grains. Accordingly, second TiO$_2$ layer 2104 above Al-doped layer 2103 also has a rutile structure by a template function. Accordingly, it is possible to improve heat resistance of the TiO$_2$ film while obtaining the smaller EOT, thereby suppressing leakage current.

In this case, TiMCTA used when forming the previous TZAZT structure was used as a Ti source for forming TiO$_2$, and TMA was used as an Al source.

Since TiMCTA performs self-organized and oriented adsorption in the same way as CTMAZ or MCTMAZ, and blocks TMA due to the cyclopentadiene ring, similarly to a case of doping Al in the ZrO$_2$ film, it is possible to suppress the density of Al atoms of the Al-doped layer to about 9.8E+13 [atoms/cm$^2$] at one ALD cycle.

A plurality of Al-doped layers 2103 is introduced in the same way as the ZrO$_2$ dielectric film, and Al concentration as a ratio of the number of atoms represented by Al/(Al+Ti) may ranges from 0.5 to 2.0 atom %. The number of introduced layers and Al concentration can be appropriately selected within a range without damaging a template function for converting a lower electrode into rutile.

In case of the TiO$_2$ film having a rutile structure, the permittivity can be increased to about 60 to 80 compared to about 30 to 45 of the tetragonal ZrO$_2$ film. Accordingly, it is possible to make the EOT smaller than that of the ZrO$_2$ film. As a result, it can be applied to a DRAM since F30 nm level.

Further, the present invention includes the following embodiments:

1. A semiconductor device including a capacitor having a dielectric film between a lower electrode and an upper electrode,
    wherein the dielectric film comprises at least one Al-doped layer, and
    an area density of Al atoms in one layer of the Al-doped layer is smaller than 1.4E+14 atoms/cm$^2$.

2. The semiconductor device according to item 1, wherein the area density of Al atoms in one layer of the Al-doped layer is equal to or smaller than 1.0E+14 atoms/cm$^2$.

3. The semiconductor device according to item 1, wherein the Al-doped layer is a layer in which aluminum oxide is studded on an oxide film of metal atom M constituting the dielectric film.

4. The semiconductor device according to item 3, wherein a concentration of Al atoms included in the dielectric film ranges from 0.2 to 2 atom % as a ratio of the number of atoms represented by Al/(Al+M).

5. The semiconductor device according to item 1, wherein the dielectric film comprises at least one of the Al-doped layer in a zirconium oxide film.

6. The semiconductor device according to item 5, wherein the upper and lower electrodes of the capacitor are formed of a TiN film, and a titanium oxide film is present at an interface between the TiN film and the zirconium oxide film.

7. The semiconductor device according to item 1, wherein the dielectric film comprises at least one of the Al-doped layer in a titanium oxide film, and the titanium oxide film has a rutile structure.

8. The semiconductor device according to item 7, wherein the lower electrode of the capacitor has RuO$_2$ in at least a surface layer.

9. The semiconductor device according to item 1, wherein an equivalent oxide thickness: EOT, of the dielectric film is equal to or smaller than 0.9 nm.

10. The semiconductor device according to item 1, wherein the lower electrode of the capacitor has a steric structure having an aspect ratio of 20 or more.

What is claimed is:

1. An adsorption site blocking atomic layer deposition method of depositing, on a base material, a first material different from the base material by an atomic layer deposition method,
    before introducing a first source gas including a first precursor as a source of the first material in a film forming space, introducing a second source gas including a blocker molecule having a group with a low affinity to the first precursor in the film forming space, and restricting an adsorption site of the first precursor on the base material by adsorbing the blocker molecule on the base material,
    purging the second source gas,
    introducing the first source gas in the film forming space, and adsorbing the first precursor on the adsorption site restricted on the base material,
    purging the first source gas, and
    introducing a reaction gas in the film forming space, and reacting the reaction gas with at least the first precursor to be converted into the first material.

2. The method according to claim 1, wherein the blocker molecule includes a group which is easy to be adsorbed on the base material, and a group which is relatively difficult to be adsorbed on the base material, the blocker molecule itself performs an oriented adsorption such that the group which is difficult to be adsorbed is self-organized toward an outside, and the group which is difficult to be adsorbed is a group having a low affinity to the first precursor to block adsorption of the first precursor to the blocker molecule.

3. The method according to claim 2, wherein the base material is metal oxide,
    the blocker molecule is a metal complex which has a metal atom constituting the metal oxide of the base material and has the group which is easy to be adsorbed on the base material and the group which is relatively difficult to be adsorbed on the base material as a substituent or ligand, and
    the reaction gas is an oxidative gas, and the reaction gas reacts with the blocker molecule to form a film in which the first material is doped in the metal oxide of the base material.

4. The method according to claim 1, wherein the blocker molecule is a monocyclopentadienyl metal complex coordinating a cyclopentadiene ring, which may have a substituent, and having a plurality of polar groups.

5. The method according to claim 4, wherein the monocyclopentadienyl metal complex is cyclopentadienyl tris(dimethylamino)zirconium, methylcyclopentadienyl tris(dimethylamino)zirconium or methylcyclopentadienyl tris(dimethylamino)titanium.

6. A method of manufacturing a semiconductor device including a capacitor having a dielectric film between a lower electrode and an upper electrode, the method comprising:
    forming the dielectric film on the lower electrode by an atomic layer deposition method; and
    forming the upper electrode on the dielectric film,
    wherein the dielectric film includes first and second dielectric films formed of the same material, and an Al-doped layer inserted between the first and second dielectric films, and forming the Al-doped layer comprises sequentially:
- (1) introducing a second source gas including a blocker molecule having a group with a low affinity to an Al precursor, and adsorbing the blocker molecule on the first dielectric film,
- (2) purging the second source gas,
- (3) adsorbing a first source gas including the Al precursor on an adsorption site of the first dielectric film on which the blocker molecule is not adsorbed,
- (4) purging the first source gas,
- (5) oxidizing Al atom in at least the Al precursor by supplying a reaction gas to react with the blocker molecule adsorbed on the first dielectric film and the Al precursor, and
- (6) purging an unreacted portion of the reaction gas and a by-product.

7. The method according to claim 6, wherein the blocker molecule includes a group which is easy to be adsorbed on the first dielectric film, and a group which is relatively difficult to be adsorbed on the first dielectric film, the blocker molecule itself performs an oriented adsorption such that the group which is difficult to be adsorbed is self-organized toward an outside, and the group which is difficult to be adsorbed is a group having a low affinity to the Al precursor to block adsorption of the Al precursor to the blocker molecule.

8. The method according to claim 6, wherein the blocker molecule is a metal complex which has metal atom M constituting the first dielectric film and has a group which is easy to be adsorbed and a group which is relatively difficult to be adsorbed as a substituent or ligand, and
the reaction gas reacts with the blocker molecule to form metal oxide constituting the first dielectric film.

9. The method according to claim 6, wherein the blocker molecule is a monocyclopentadienyl metal complex having metal atom M constituting the first dielectric film, polar groups and a cyclopentadiene ring which may have a substituent, and the reaction gas reacts with the blocker molecule to form metal oxide constituting the first dielectric film.

10. The method according to claim 6, wherein the Al precursor is trimethylaluminum.

11. The method according to claim 10, wherein the first and second dielectric films are formed of an zirconium oxide film, and the blocker molecule is cyclopentadienyl tris(dimethylamino)zirconium or methylcyclopentadienyl tris(dimethylamino)zirconium.

12. The method according to claim 11, wherein the first and second dielectric films are formed by an atomic layer deposition method using the blocker molecule as a precursor.

13. The method according to claim 12, wherein the upper and lower electrodes of the capacitor are formed of a TiN film, and further comprising forming a titanium oxide film at an interface between the TiN film and the zirconium oxide film.

14. The method according to claim 10, wherein the first and second dielectric films are formed of a titanium oxide film, and the blocker molecule is methylcyclopentadienyl tris(dimethylamino)titanium.

15. The method according to claim 14, wherein the first and second dielectric films are formed by an atomic layer deposition method using the blocker molecule as a precursor.

16. The method according to claim 14, wherein the lower electrode of the capacitor is formed of $RuO_2$.

17. The method according to claim 6, wherein the Al-doped layer is formed as at least one layer in the dielectric film, and film formation of one layer is carried out by performing only one cycle of the steps (1) to (6).

18. The method according to claim 17, wherein an area density of Al atoms in one layer of the Al-doped layer is smaller than $1.4E+14$ atoms/cm$^2$.

19. The method according to claim 18, wherein the area density of Al atoms in one layer of the Al-doped layer is equal to or smaller than $1.0E+14$ atoms/cm$^2$.

20. The method according to claim 17, wherein a concentration of Al atoms included in the dielectric film ranges from 0.2 to 2 atom % as a ratio of the number of atoms represented by Al/(Al+M) with respect to metal atom M constituting the dielectric film.

* * * * *